United States Patent
Shan et al.

(10) Patent No.: US 10,950,319 B2
(45) Date of Patent: Mar. 16, 2021

(54) SHIFT REGISTER AND CORRESPONDING DRIVING METHOD, GATE DRIVING CIRCUIT AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Yue Shan, Beijing (CN); Jiguo Wang, Beijing (CN); Jun Fan, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 75 days.

(21) Appl. No.: 16/339,752

(22) PCT Filed: Sep. 14, 2018

(86) PCT No.: PCT/CN2018/105694
§ 371 (c)(1),
(2) Date: Apr. 5, 2019

(87) PCT Pub. No.: WO2019/100822
PCT Pub. Date: May 31, 2019

(65) Prior Publication Data
US 2020/0286570 A1    Sep. 10, 2020

(30) Foreign Application Priority Data
Nov. 27, 2017  (CN) .......................... 201711204895.0

(51) Int. Cl.
G11C 19/28 (2006.01)
G09G 3/20 (2006.01)

(52) U.S. Cl.
CPC ........... *G11C 19/28* (2013.01); *G09G 3/2092* (2013.01); *G09G 2310/0286* (2013.01)

(58) Field of Classification Search
CPC ................. G11C 19/28; G09G 3/2092; G09G 2310/0286
USPC ........................................................ 345/100
See application file for complete search history.

(Continued)

(56) References Cited

U.S. PATENT DOCUMENTS

| | | | | |
|---|---|---|---|---|
| 2014/0168050 A1* | 6/2014 | Gu | ........................ | G09G 3/3648 345/100 |
| 2015/0255031 A1* | 9/2015 | Cao | ........................ | G11C 19/28 345/210 |

FOREIGN PATENT DOCUMENTS

| | | | | |
|---|---|---|---|---|
| CN | 105096865 A | * | 11/2015 | ........... G09G 3/3677 |
| CN | 106157912 A | * | 11/2016 | |

* cited by examiner

*Primary Examiner* — Mark Edwards
(74) *Attorney, Agent, or Firm* — Leason Ellis LLP

(57) ABSTRACT

A shift register and a corresponding driving method, a gate driving circuit and a display device, the shift registers includes an input and reset circuit, a first output circuit, a second output circuit, a first pull-down circuit and a second pull-down circuit; the first output circuit and the second output circuit output gate driving signals according to potentials at a first clock signal terminal and a second clock signal terminal respectively, the first pull-down circuit and the second pull-down circuit reset potentials at a pull up node, a first output terminal and a second output terminal according to potentials at a first pull-down node a second pull-down node respectively.

19 Claims, 8 Drawing Sheets

SHIFT REGISTER AND CORRESPONDING DRIVING METHOD, GATE DRIVING CIRCUIT AND DISPLAY DEVICE

CROSS-REFERENCE TO RELATED PATENT APPLICATIONS

This application is a U.S. National Stage Application under 35 U.S.C. § 371 of International Patent Application No. PCT/CN2018/105694, filed Sep. 14, 2018, which claims the benefit of priority of Chinese patent application No. 201711204895.0 filed on Nov. 27, 2017, both of which are incorporated by reference in their entireties as part of this application.

TECHNICAL FIELD

The present disclosure relates to the field of display technique, and more particularly, to a shift register and a corresponding driving method, a gate driving circuit and a display device.

BACKGROUND

As a main driving circuit in the display, performances of the gate driving circuit (GOA) directly affect the liquid crystal display's quality. In the case of onboard display device, reliability requirements for GOA are more demanding. In recent years, liquid crystal display (LCD) panels have become larger and larger in size, more and more integrated, and more and more complicated in terms of circuit structure. The demands for reducing power consumption and increasing system stability or the like have also increased, and low power consumption and stability have become the focus of attention in the field of GOA technique. With relatively few switching components, enhancing driving control capability of the single-stage shift register and improving reliability of the display driven by the GOA are useful to realize a narrow-bezel onboard display product.

SUMMARY

The present disclosure provides a shift register and a corresponding driving method, a gate driving circuit and a display device.

An aspect of the present disclosure provides a shift register, and the shift register may comprise: an input and reset circuit connected to an input terminal, a pull-up node and a reset terminal, and configured to set the potential at the pull-up node to an operating potential when the potential at the input terminal is the operating potential, and set the potential at the pull-up node to a reset potential when the potential at the reset terminal is the operating potential; a first output circuit connected to the pull-up node, a first control signal terminal and a first output terminal, and configured to output a first gate driving signal at the first output terminal when the potential at the pull-up node and the potential at the first control signal terminal are the operating potential; a second output circuit connected to the pull-up node, a second control signal terminal and a second output terminal, and configured to output a second gate driving signal at the second output terminal when the potential at the pull-up node and the potential at the second control signal terminal are the operating potential; a first pull-down circuit, connected to a first pull-down node, the pull-up node, the first output terminal and the second output terminal, and configured to set the potentials at the pull-up node, the first output terminal and the second output terminal to the reset potential when the potential at the first pull-down node is the operating potential; a second pull-down circuit, connected to a second pull-down node, the pull-up node, the first output terminal and the second output terminal, and configured to set the potentials at the pull-up node, the first output terminal and the second output terminal to the reset potential when the potential at the second pull-down node is the operating potential; and a pull-down node selection circuit connected to a first pull-down node selection signal terminal, a second pull-down node selection signal terminal, the first pull-down node and the second pull-down node, and configured to select one of the first pull-down node and the second pull-down node as an active pull-down node according to the potential at the first pull-down node selection signal terminal and the potential at the second pull-down node selection signal terminal.

In an embodiment, the pull-down node selection circuit may comprise: a first pull-down selection switching element, a control terminal thereof being connected to the first pull-down node selection signal terminal, and one of a first terminal and a second terminal thereof being connected to the first pull-down node; a second pull-down selection switching element, a control terminal thereof being connected to the first pull-down node selection signal terminal, one of a first terminal and a second terminal thereof being connected to the second pull-down node, and the other one of the first terminal and the second terminal thereof being connected to a reference signal terminal; a third pull-down selection switching element, a control terminal thereof being connected to the second pull-down node selection signal terminal, one of a first terminal and a second terminal thereof being connected to the second pull-down node, and the other one of the first terminal and the second terminal thereof being connected to the other one of the first terminal and the second terminal of the first pull-down selection switching element; and a fourth pull-down selection switching element, a control terminal thereof being connected to the second pull-down node selection signal terminal, one of a first terminal and a second terminal thereof being connected to the first pull-down node, and the other one of the first terminal and the second terminal thereof being connected to the reference signal terminal.

In an embodiment, the pull-down node selection circuit may further comprise: a first capacitor connected between the first pull-down node and the reference signal terminal; and a second capacitor connected between the second pull-down node and the reference signal terminal.

In an embodiment, the pull-down node selection circuit may further comprise: a selection control switching element, a control terminal thereof and one of a first terminal and a second terminal thereof being both connected to the pull-down selection control signal terminal, and the other one of the first terminal and the second terminal thereof being connected to the other one of the first terminal and the second terminal of the first pull-down selection switching element and to the other one of the first terminal and the second terminal of the third pull-down selection switching element.

In an embodiment, the input and reset circuit may comprise: a first input switching element, a control terminal thereof being connected to the input terminal, one of a first terminal and a second terminal thereof being connected to a first scanning control signal terminal, and the other one of the first terminal and the second terminal thereof being connected to the pull-up node; and a second input switching element, a control terminal thereof being connected to the reset terminal, one of a first terminal and a second terminal thereof being connected to a second scanning control signal terminal, and the other one of the first terminal and the second terminal thereof being connected to the pull-up node, wherein the potential of a first scanning control signal is the operating potential and the potential of a second scanning control signal is the reset potential during a forward scanning, whereas the potential of the first scanning control signal is the reset potential and the potential of the second scanning control signal is the operating potential during a reverse scanning.

In an embodiment, the input and reset circuit may further comprise: a first pull-down node reset switching element, a control terminal thereof being connected to the pull-up node, one of a first terminal and a second terminal thereof being connected to the first pull-down node, and the other one of the first terminal and the second terminal thereof being connected to the reference signal terminal; and a second pull-down node reset switching element, a control terminal thereof being connected to the pull-up node, one of a first terminal and a second terminal thereof being connected to the second pull-down node, and the other one of the first terminal and the second terminal thereof being connected to the reference signal terminal.

In an embodiment, the first output circuit may comprise: a first output switching element, a control terminal thereof being connected to an operating potential terminal, and one of a first terminal and a second terminal thereof being connected to the pull-up node; a second output switching element, a control terminal thereof being connected to the other one of the first terminal and the second terminal of the first output switching element, one of a first terminal and a second terminal thereof being connected to the first control signal terminal, the other one of the first terminal and the second terminal thereof being connected to the first output terminal; and a first output capacitor connected between the control terminal of the second output switching element and the first output terminal.

In an embodiment, the second output circuit may comprise: a third output switching element, a control terminal thereof being connected to the operating potential terminal, and one of a first terminal and a second terminal thereof being connected to the pull-up node; a fourth output switching element, a control terminal thereof being connected to the other one of the first terminal and the second terminal of the third output switching element, one of a first terminal and a second terminal thereof being connected to the second control signal terminal, and the other of the first terminal and the second terminal thereof being connected to the second output terminal; and a second output capacitor connected between the control terminal of the fourth output switching element and the second output terminal.

In an embodiment, the first pull-down circuit may comprise: a first pull-down switching element, a control terminal thereof being connected to the first pull-down node, one of a first terminal and a second terminal thereof being connected to the pull-up node, and the other one of the first terminal and the second terminal thereof being connected to the reference signal terminal; a second pull-down switching element, a control terminal thereof being connected to the first pull-down node, one of a first terminal and a second terminal being connected to the first output terminal, and the other one of the first terminal and the second terminal thereof being connected to the reference signal terminal; and a third pull-down switching element, a control terminal thereof being connected to the first pull-down node, one of a first terminal and a second terminal thereof being connected to the second output terminal, and the other one of the first terminal and the second terminal thereof being connected to the reference signal terminal.

In an embodiment, the second pull-down circuit may comprise: a fourth pull-down switching element, a control terminal thereof being connected to the second pull-down node, one of a first terminal and a second terminal thereof being connected to the pull-up node, and the other one of the first terminal and the second terminal thereof being connected to the reference signal terminal; a fifth pull-down switching element, a control terminal thereof being connected to the second pull-down node, one of a first terminal and a second terminal thereof being connected to the first output terminal, and the other one of the first terminal and the second terminal thereof being connected to the reference signal terminal; and a sixth pull-down switching element, a control terminal thereof being connected to the second pull-down node, one of a first terminal and a second terminal thereof being connected to the second output terminal, and the other one of the first terminal and the second terminal thereof being connected to the reference signal terminal.

Another aspect of the present disclosure provides a gate driving circuit, comprising multiple cascaded shift registers as described above, wherein except the shift register at the first stage, an input terminal of the shift register at the other stage is connected to a second output terminal of the shift register cascaded at the previous stage, and except the shift register at the last stage, a reset terminal of the shift register at the other stage is connected to a first output terminal of the shift register at the next stage.

Still another aspect of the present disclosure provides a display device includes the gate driving circuit as described above.

Still another aspect of the present disclosure provides the display device which may comprise a first gate driving circuit and a second gate driving circuit, the first gate driving circuit comprising N cascaded shift registers as described above, the second gate driving circuit comprising N cascaded shift registers as described above; wherein a reset terminal of the shift register at the first stage of the first gate driving circuit is connected to a first output terminal of the shift register at the first stage of the second gate driving circuit; an input terminal of the shift register at the i-th stage of the first gate driving circuit is connected to a second output terminal of the shift register at the (i−1)-th stage of the second gate driving circuit, and a reset terminal of the shift register at the i-th stage of the first gate driving circuit is connected to a first output terminal of the shift register at the i-th stage of the second gate driving circuit, where $1<i\leq N$; an input terminal of the shift register at the j-th stage of the second gate driving circuit is connected to a second output terminal of the shift register at the j-th stage of the first gate driving circuit, and a reset terminal of the shift register at the j-th stage of the second gate driving circuit is connected to a first output terminal of the shift register at the (j+1)-th stage of the first gate driving circuit, where $1\leq j<N$.

Yet still another aspect of the present disclosure provides a method for driving the shift register as described above, comprising: within two adjacent frames, alternately setting one of the first pull-down node and the second pull-down node as an active pull-down node, and setting the potential at the other pull-down node to a reset potential in the case where one pull-down node is arranged as the active node; within each frame, for the shift register at each stage, in a first period, in response to receipt of an input signal, pulling up the potential at the pull-up node to an operating potential; in a second period, in response to receipt of a first clock signal, outputting the first gate driving signal at the first output terminal, and in response to a second clock signal received after the first clock signal, outputting the second gate driving signal at the second output terminal; in a third period, in response to a reference signal received after the second clock signal, setting the potential at the active pull-down node to the operating potential; and setting the potentials at the pull-up node, the first output terminal and the second output terminal to the reset potential.

In an embodiment, the first pull-down node and the second pull-down node may be alternately used as the active pull-down node in accordance with a predetermined number of frames.

DETAILED DESCRIPTION OF THE EMBODIMENTS

Figure 1:
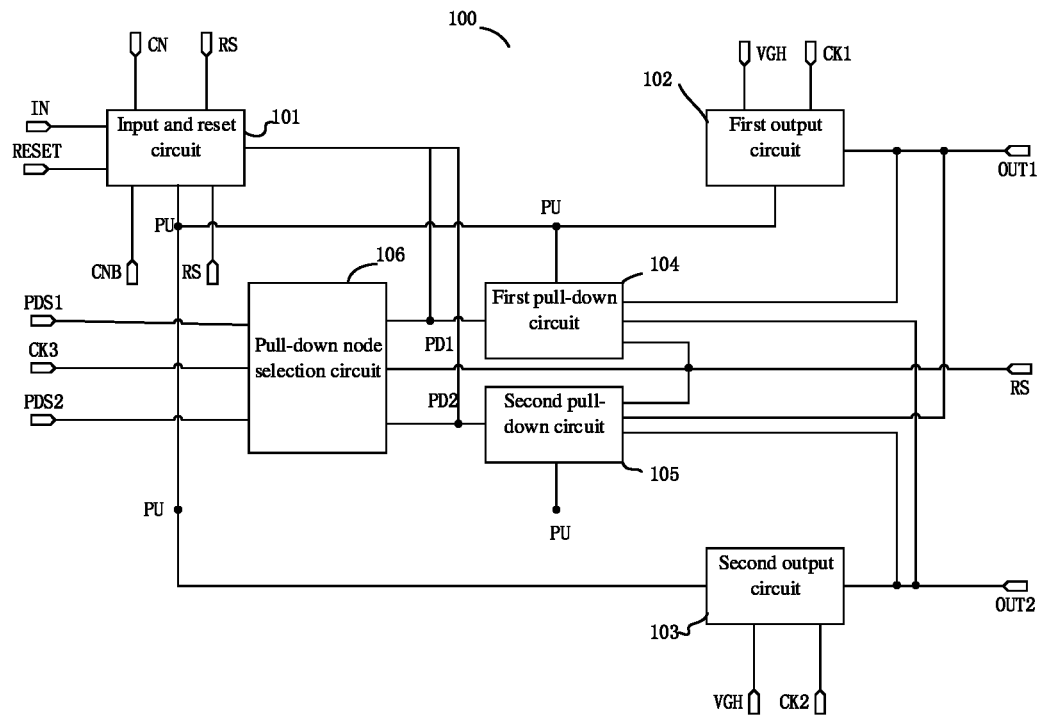
FIG. 1 illustrates a shift register according to an embodiment of the present disclosure.

Embodiments of the present disclosure will be described below in conjunction with the drawings. These described embodiments are merely exemplary, not intend to limit the scope of the present disclosure.

In this description, the ordinal numerals "first", "second", etc. are used to distinguish different terminals, elements or circuits, not intend to limit the order and/or importance of such terminals, elements or circuits.

As used herein, the term "operating potential" refers to a potential capable of turning on a corresponding switching element or capable of enabling a corresponding circuit to operate. For example, if the switching element needs to be turned on when the potential at its control terminal is a high level, the operating potential may correspond to a high level, and if the switching element needs to be turned on when the potential at its control terminal is a low level, the operating potential may correspond to a low potential. The term "reset potential" refers to a potential opposite to the "operating potential", that is, a potential capable of turning off a corresponding switching element or enabling a corresponding circuit not to operate. For example, if the operating potential corresponds to a high level, the reset potential may correspond to a low level; or, if the operating potential corresponds to a low level, the reset potential may correspond to a high level. The operating potential and the reset potential may be determined according to the actual circuit conditions. In the following description, for the sake of brevity, a high level is selected as the operating potential, and a low level is selected as the reset potential. However, the technical solution of the present disclosure is not limited to such example.

Herein, in the case where a signal of a high level is received via the terminal, or in the case where the terminal is connected to a power source capable of supplying a high level, the potential at the terminal is a high level, or the terminal is at a high level. In the case where a signal of a high level is not received via the terminal, or in the case where the terminal is connected to a power source capable of supplying a low level, the potential at the terminal is a low level, or the terminal is at a low level.

Herein, the high level and the low level are relative. A voltage value or voltage range of the low level may be selected according to the actual circuit conditions and the design standard, so that when the voltage is the selected value or within the selected range, the corresponding switching element is turned off or the corresponding circuit does not operate. The voltage value of the high level is usually higher than that of the low level. Similarly, a voltage value or voltage range of the high level may be selected according to the actual circuit conditions and the design standard, so that when the voltage is the selected value or within the selected range, the corresponding switching element can be turned on or the corresponding circuit can operate.

In addition, both the high and low levels may correspond to different voltage values within a certain range. For example, in the case where distinction is required, terms like "first high level" and "second high level" may be used to describe high levels having different voltage values within a high level range. In this description, for the convenience of description, it is possible to use "1" to represent the high level and "0" to represent for the low level.

In addition, the switching element may be any element or circuit having a control terminal and capable of functioning as a switch. Such switching element can be turned on, for example, when the potential at its control terminal is a high level, that is, a path is formed between its first terminal and its second terminal, such that the potentials at its first terminal and its second terminal are the same or substantially the same. In a practical case, when the switching element is turned on, the potentials at its first terminal and its second terminal are not necessarily identical due to turn-on resistance of the switching element, there may be some difference. Herein, for the sake of brevity, unless it is specifically pointed out or the influence of the turn-on resistance needs to be considered, it is simply assumed that the potentials at the first terminal and the second terminal of the switching element are the same when the switching element is turned on.

In an actual circuit, such switching element may employ various types of switching device having a control terminal such as a thin film transistor or a field effect transistor as needed, and may adopt an N-channel type or a P-channel type as needed. Herein, description will be made by taking the switching element of an N-channel type thin film transistor as an example. In the example of this description, the control terminal of the switching element may correspond to the gate of the transistor, one of the first terminal and the second terminal of the transistor may correspond to one of the source and the drain of the transistor, the other one of the first terminal and the second terminal of the transistor may correspond to the other one of the source and the drain of the transistor. In this description, the first terminal and the second terminal of the switch are interchangeable. However, the technical solution of the present disclosure is not limited to such example.

FIG. 1 illustrates an exemplary shift register 100 according to an embodiment of the present disclosure. The shift register 100 comprises an input and reset circuit 101, a first output circuit 102, a second output circuit 103, a first pull-down circuit 104, a second pull-down circuit 105 and a pull-down node selection circuit 106. As illustrated in FIG. 1, the shift register 100 further comprises a first pull-down node PD1 and a second pull-down node PD2.

The input and reset circuit 101 is connected to an input terminal, a pull-up node and a reset terminal, and is configured in entirety to set the potential at the pull-up node to an operating potential when the potential at the input terminal is the operating potential, and set the potential at the pull-up node to a reset potential when the potential at the reset terminal is the operating potential.

Figure 2:
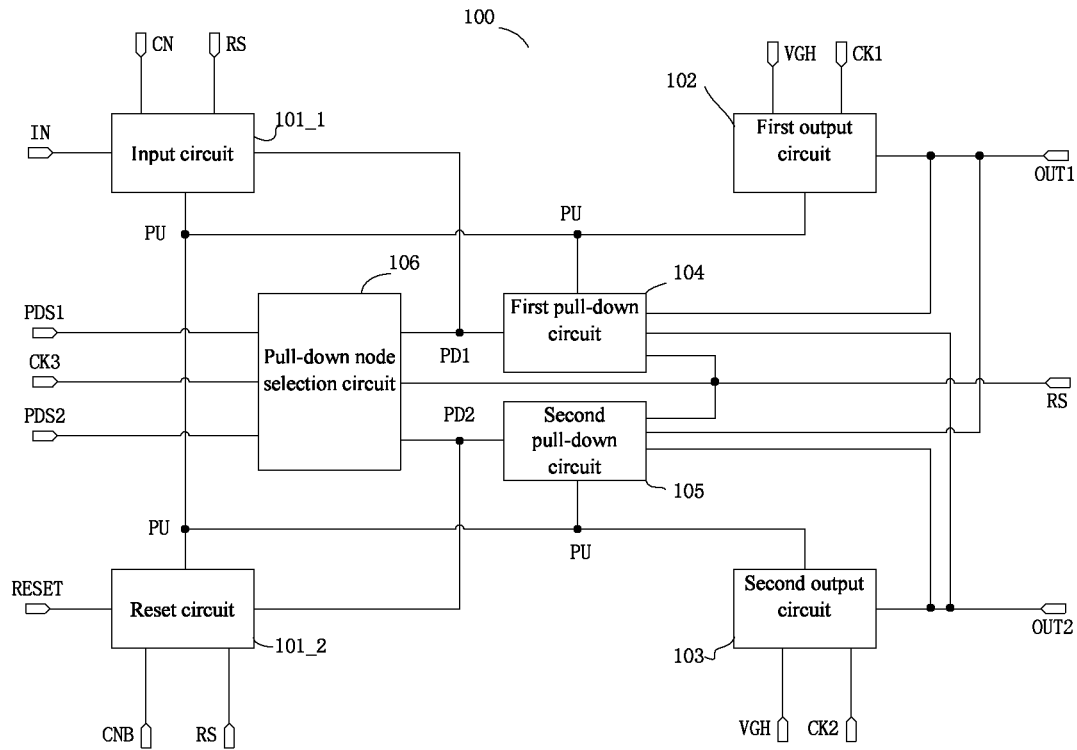
FIG. 2 illustrates another circuit structure schematic diagram of the shift register illustrated in FIG. 1.

Specifically, the input and reset circuit 101 illustrated in FIG. 1 may include an input circuit 101_1 and a reset circuit 101_2 as illustrated in FIG. 2. It should be understood that the shift registers illustrated in FIGS. 1 and 2 differ in that the input and reset circuit in FIG. 1 is split into an input circuit 101_1 and a reset circuit 101_2 as illustrated in FIG. 2.

As illustrated in FIG. 2, the input circuit 101_1 is connected to an input terminal IN of the shift register 100, a first scanning direction control terminal CN and a pull-up node PU. When a signal is received via the input terminal IN, the input circuit 101_1 can, by turning on its internal switching element, enable the pull-up node PU to be connected to the input terminal IN and/or the first scanning direction control terminal CN, thereby causing the potential at the pull-up node PU to become an operating potential, such as a high level.

The input circuit 101_1 may be implemented in different ways, and may be connected to different terminals of the shift register 100 according to needs and implementations, so that when an input signal is received via the input terminal IN, the potential at the pull-up node PU is set to the operating potential.

In an example, the input circuit 101_1 may also be connected to an operating potential terminal VGH, wherein when a signal is received via the input terminal IN, the input circuit 101_1 may, by turning on its internal switching element, enable the pull-up node PU and the operating potential terminal VGH to be connected, thereby causing the potential at the pull-up node PU to become the operating potential.

In a further example, the input circuit 101_1 may also be connected to a clock signal terminal, and the clock signal terminal provides a high-level clock signal when a signal is received via the input terminal IN, wherein when a signal is received via the input terminal IN, the input circuit 101_1 can, by turning on its internal switching element, enable the pull-up node PU to be connected to the clock signal terminal, thereby causing the potential at the pull-up node PU to become the operating potential.

In an example, the input circuit 101_1 may include at least one switching element, and for example, the control terminal of the switching element may be connected to the input terminal IN, one of the first terminal and the second terminal thereof may be connected to the pull-up node PU, and according to the situation the other one of the first terminal and the second terminal thereof is connected to the first scanning direction control terminal CN or the operating potential terminal VGH or the clock signal terminal as mentioned above.

In the example illustrated in FIG. 1, the input circuit 101_1 is also connected to the first pull-down node PD1 and a reference signal terminal RS. While the pull-up node PU is set to a high level, the input circuit 101_1 can, for example by turning on the internal switching element, enable the reference signal terminal RS and the first pull-down node PD1 to be connected, thereby setting the first pull-down node PD1 to a low level.

In a further example, the input circuit 101_1 may not be connected to the first pull-down node PD1 and the reference signal terminal RS, or the shift register 100 may implement a similar function in another manner. For example, separate components, circuits and sub-circuits may be disposed in the shift register 100 to ensure that the first pull-down node PD1 is set to a low level while the pull-up node PU is set to a high level. In an example, a separate switching element may be disposed outside the input circuit 101_1, the control terminal and the first terminal of the switching element are connected to the pull-up node PU and the first pull-down node PD1 respectively, so that the potential at the second terminal of the switching element is a low level when the shift register 100 receives a signal via the input terminal IN. In this way, when the shift register 100 receives a signal via the input terminal IN, the input circuit 101_1 operates and causes the pull-up node PU to become a high level, and the switch is turned on when the pull-up node PU is at a high level, so that the potential at the first pull-down node PD1 is a low level.

In the example illustrated in FIG. 2, the reset circuit 101_2 is connected to the reset terminal RESET of the shift register 100, a second scanning direction control terminal CNB and the pull-up node PU. When a signal is received via the reset terminal RESET, the reset circuit 101_2 can, by turning on its internal switching element, enable the pull-up node PU to be connected to the reset terminal RESET and/or the second scanning direction control terminal CNB, thereby causing the potential at the pull-up node PU to become a reset potential, for example, a low level.

The reset circuit 101_2 may be implemented in different ways, and may be connected to different terminals of the shift register 100 according to needs and implementations, so that when a signal is received via the reset terminal RESET, the potential at the pull-up node PU is set to the reset potential.

For example, the reset circuit 101_2 may be connected to the reference signal terminal RS, the signal of the reference signal terminal RS may be a direct current (DC) signal or an alternating current (AC) signal, and in a reset phase, the signal of the reference signal terminal RS is at a low level.

Specifically, the reference signal terminal RS may be the reset potential terminal VGL, and the reset potential terminal VGL outputs a DC low level signal. When a signal is received via the reset terminal RESET, the reset circuit 101_2 can, by turning on its internal switching element, enable the pull-up node PU and the reset potential terminal VGL to be connected, thereby causing the potential at the pull-up node PU to become the reset potential.

In another example, the reference signal terminal RS may also be one clock signal terminal, the clock signal terminal provides a low-level clock signal when the reset terminal RESET receives a signal. When a signal is received via the reset terminal RESET, the reset circuit 102 can, by turning on its internal switching element, enable the pull-up node PU to be connected to the clock signal terminal, thereby causing the potential at the pull-up node PU to become the reset potential.

In an example, the reset circuit 101_2 may include at least one switching element, and can for example connect the control terminal of the switching element to the reset terminal RESET, connect one of the first terminal and the second terminal of the switching element to the pull-up node PU, and connect the other one of the first terminal and the second terminal of the switching element to the second scanning direction control terminal CNB or the reference signal terminal RS (e.g., RS is the reset potential terminal VGL or the clock signal terminal mentioned above) according to circumstances.

In the example illustrated in FIG. 2, the reset circuit 101_2 is also connected to the second pull-down node PD2 and the reference signal terminal RS. While the pull-up node PU is set to a high level, the reset circuit 102 can, for example by turning on its internal switching element, enable the reference signal terminal RS and the second pull-down node PD2 to be connected, thereby setting the second pull-down node PD2 to a low level.

In another example, the reset circuit 101_2 may be not connected to the second pull-down node PD2 and the reference signal terminal RS, or the shift register 100 may adopt another manner to implement a similar function. In an example, separate components, circuits and sub-circuits may be disposed in shift register 100 to ensure that second pull-down node PD2 is set to a low level while the pull-up node PU is set to a high level. For example, a separate switching element may be disposed outside the reset circuit 101_2, the control terminal and the first terminal of the switching element are connected to the pull-up node PU and the second pull-down node PD2 respectively, and the potential at the second terminal of the switching element is a low level when the shift register 100 receives a signal via the input terminal IN. In this way, when the shift register 100 receives a signal via the input terminal IN, the input circuit 101_1 operates and accordingly the pull-up node PU becomes a high level, the switch is turned on when the pull-up node PU is at a high level, thereby causing the potential at the second pull-down node PD2 to be a low level.

The shift register 100 illustrated in FIG. 1 can support bidirectional scanning.

When the first scanning direction control terminal CN is at a high level and the second scanning direction control terminal CNB is at a low level, the shift register 100 can operate in a forward scanning mode. In the forward scanning mode, the input circuit 101_1 sets the pull-up node PU to a high level when the shift register 100 receives a signal via the input terminal IN, and the reset circuit 101_2 sets the pull-up node PU to a low level when the shift register 100 receives a signal via the reset terminal RESET.

When the first scanning direction control terminal CN is at a low level and the second scanning direction control terminal CNB is at a high level, the shift register 100 can operate in a reverse scanning mode. In the reverse scanning mode, in terms of the working process and the function, the input circuit 101_1 may correspond to the reset circuit 101_2 in the forward scanning mode, and the reset circuit 101_2 may correspond to the input circuit 101_1 in the forward scanning mode, and a required clock signal (if any) can be adjusted accordingly.

In the case of supporting bidirectional scanning, the input circuit 101_1 may also be referred to as the first input circuit, and the reset circuit 101_2 may also be referred to as the second input circuit.

In the case where the bidirectional scanning function is not required to be supported, the input circuit and the reset circuit in the shift register according to an embodiment of the present disclosure may adopt a setting different than that of the input circuit and the reset circuit in the shift register 100 illustrated in FIG. 1.

For example, in the case where the bidirectional scanning function is not required to be supported, the first scanning direction control terminal CN and the second scanning direction control terminal CNB may be not disposed in the shift register 100, accordingly, the input circuit 101_1 and the reset circuit 101_2 may not be connected to the first scanning direction control terminal CN and the second scanning direction control terminal CNB, but other implementations such as those described above may be employed.

Figure 3:
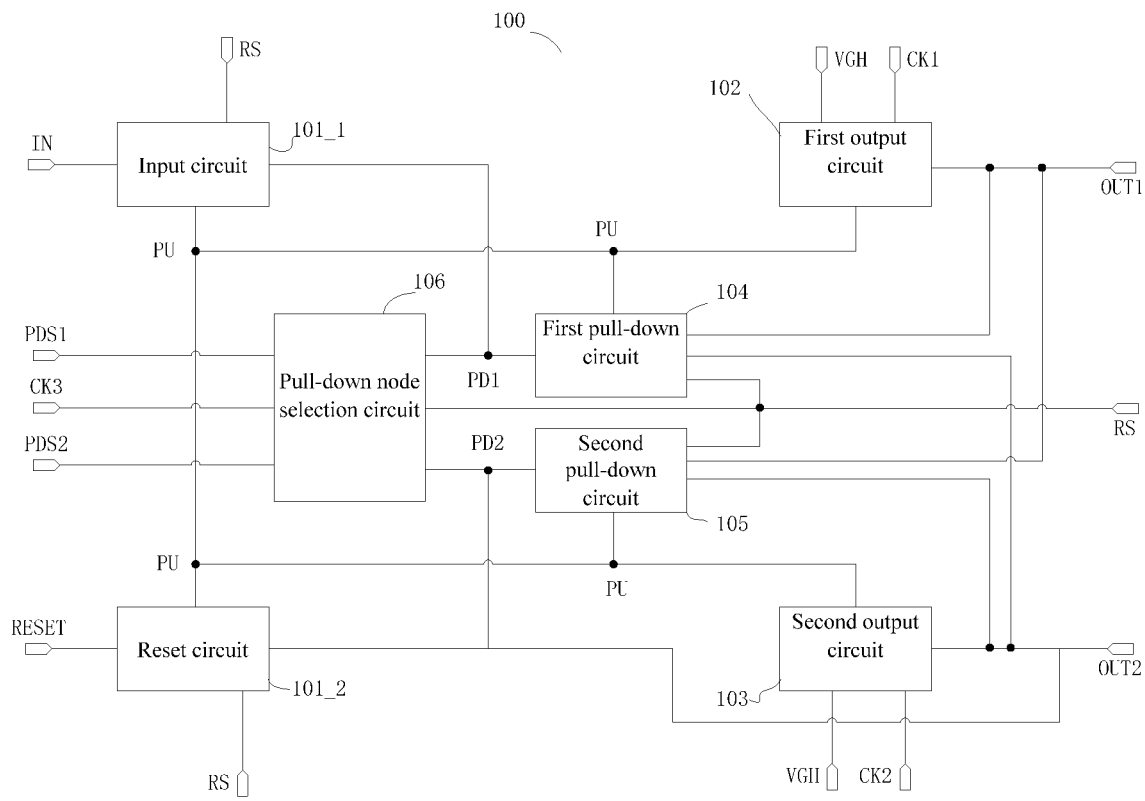
FIG. 3 illustrates a shift register according to another embodiment of the present disclosure.

In addition, in the case where the bidirectional scanning function is not required to be supported, as illustrated in FIG. 3, the reset circuit 101_2 may also be connected to the output terminal of the shift register (e.g., the first output terminal OUT1 and/or the second output terminal OUT2 in FIG. 1 or FIG. 2), and the output terminal of the shift register is also set to a low level when a signal is received via the reset terminal RESET. For example, in an example, the reset circuit 101_2 may include another switching element, and the control terminal, the first terminal and the second terminal of this switching element are connected to the reset terminal RESET, the output terminal and the reference signal terminal RS of the shift register respectively.

In the shift register 100, the first output circuit 102 is connected to the pull-up node PU, the first clock signal terminal CK1 and the first output terminal OUT1. When the shift register 100 receives a signal via the input terminal IN, the potential at the pull-up node PU becomes a high level under control of the input circuit 101_1, the first output circuit 102 starts to operate, and maintains (or registers) the potential at the pull-up node PU at a high level, but no gate driving signal is outputted at the first output terminal OUT1. Subsequently, when the shift register 100 receives the first clock signal via the first clock signal terminal CK1, the first output circuit 102 outputs a gate driving signal at the first output terminal OUT1, thereby completing shift outputting.

In an example, the first output circuit 102 may include a capacitor and at least one switching element, wherein, for example, the capacitor may be disposed between the pull-up node PU and the first output terminal OUT1, the control terminal, the first terminal and the second terminal of the switching element are connected to the pull-up node PU, the first clock signal terminal CK1 and the first output terminal OUT1 respectively, and the first clock signal terminal CK1 is at a low level when the shift register 100 receives an input signal.

When the shift register 100 receives an input signal via the input terminal IN, the potential at the pull-up node PU becomes a high level under control of the input circuit 101_1, the capacitor in the first output circuit 102 starts to be charged. However, since the first clock signal terminal CK1 is at a low level at this moment, the potentials at the first terminal and the second terminal of the switching element after being turned on are both at a low level, so that there is no gate driving outputted at the first output terminal OUT1. Subsequently, the potential at the pull-up node PU is maintained at a high level due to the bootstrap action of the capacitor in the first output circuit 102, and may even be further pulled up, and the switching element in the first output circuit 102 is kept in a turned-on state. Thereafter, when the shift register 100 receives the first clock signal (or the first clock signal terminal CK1 is at a high level), the potentials at the first terminal and the second terminal of the switching element in the first output circuit 102 both become a high level, thereby a gate driving signal is outputted at the first output terminal OUT1.

In a further example, the first output circuit 102 may also not include a capacitor.

In the shift register 100, the second output circuit 103 is connected to the pull-up node PU, the second clock signal terminal CK2 and the second output terminal OUT2. Circuit structure inside the second output circuit 103 may be the same as or different from that of the first output circuit 102.

The working principle of the second output circuit 103 and its connection with other nodes, circuits or components in the shift register 100 are similar to those of the first output circuit 102, except that the second output circuit 103 outputs a gate driving signal at the second output terminal OUT2 based on the second clock signal received via the second clock signal terminal CK2.

In an example, the second clock signal may be set to be later than the first clock signal (e.g., a rising edge of the high level of the second clock signal may be aligned with a falling edge of the high level of the first clock signal), so that the shift register 100 is capable of sequentially outputting multiple gate driving signals through the first output terminal OUT1 and the second output terminal OUT2.

Although FIG. 1 or FIG. 2 illustrates only two output circuits 102 and 103, in the case where it is required to support multiple outputs, the shift register according to an embodiment of the present disclosure may comprise three or more output circuits, which may adopt a similar circuit structure and a similar connection manner as the first output circuit 102 and the second output circuit 103, and reference may be made to the relationship between the first clock signal terminal CK1, the second clock signal terminal CK2, the first clock signal and the second clock signal, plurality of clock terminals are arranged for plurality of output circuits, and the relationships between the clock signals received via these more clock terminals respectively are determined.

In the shift register 100, two pull-down nodes PD1 and PD2 are disposed, and a first pull-down circuit 104 and a second pull-down circuit 105 are comprised, wherein the first pull-down circuit 104 is connected to the first pull-down node PD1, the pull-up node PU, the first output terminal OUT1, the second output terminal OUT2 and the reference signal terminal RS, and the second pull-down circuit 105 is connected to the second pull-down node PD2, the pull-up node PU, the first output terminal OUT1, the second output terminal OUT2 and the reference signal terminal RS.

The first pull-down circuit 104 operates when the potential at the first pull-down node PD1 is a high level, internal switching elements therein are turned on, so that the pull-up node PU, the first output terminal OUT1, the second output terminal OUT2 are connected with the reference signal terminal RS respectively, and thereby the potentials at the pull-up node PU, the first output terminal OUT1 and the second output terminal OUT2 all become a low level. The second pull-down circuit 105 operates when the potential at the second pull-down node PD2 is a high level, its internal switching element is turned on, so that the pull-up node PU, the first output terminal OUT1, the second output terminal OUT2 are connected with the reference signal terminal RS respectively, and thereby the potentials at the pull-up node PU, the first output terminal OUT1 and the second output terminal OUT2 all become a low level.

In an example, the first pull-down circuit 104 may include at least three switching elements, wherein the control terminal of each of the three switching elements is connected to the first pull-down node PD1, the first terminal of each of the three switching elements is connected to the reset signal terminal RS, and the second terminals of the three switching elements are connected to the pull-up node PU, the first output terminal OUT1 and the second output terminal OUT2 respectively. The second pull-down circuit 105 may adopt a similar circuit structure, except that the control terminals of the switching elements in the second pull-down circuit 105 are connected to the second pull-down node PD2.

In an example, multiple pull-down nodes may be used simultaneously. For example, the two pull-down nodes PD1 and PD2 in FIG. 1 or FIG. 2 may be simultaneously at a high level or a low level, thereby causing the two pull-down circuits 104 and 105 to operate simultaneously or not operate simultaneously. Accordingly, pull-down capability for the potentials at the pull-up node PU, the first output terminal OUT1 and the second output terminal OUT2 can be improved.

In a further example, multiple pull-down nodes may be used alternately. For example, multiple pull-down nodes may be alternately used with one frame as a unit. In an example, the potential at the second pull-down node PD2 may be always at a low level during a first frame period, such that during the period of this frame, only the first pull-down circuit 104 can operate, and the second pull-down circuit 105 never operates; during a subsequent second frame period, the potential at the first pull-down node PD1 is always at a low level, so that during the period of the frame, only the second pull-down circuit 105 can operate, and the pull-down circuit 104 never operates. It is also possible to alternately adopt multiple pull-down nodes and corresponding multiple pull-down circuits with multiple frames as a unit. For example, the potential at the second pull-down node PD2 may be always a low level during the first frame period and the second frame period, so that during the first frame period and the second frame period, only the first pull-down circuit 104 can operate, and the second pull-down circuit 105 never operates; during the subsequent third frame period and fourth frame period, the potential at the first pull-down node PD1 is always at a low level, so that during the third frame period and the fourth frame period, only the second pull-down circuit 105 can operate, and the first pull-down circuit 104 never operates. Alternate use of multiple pull-down nodes and corresponding pull-down circuits is beneficial to improve circuit reliability.

Although FIG. 1 illustrates only two pull-down nodes and two pull-down circuits, the shift register according to an embodiment of the present disclosure may comprise three or more pull-down nodes and corresponding pull-down circuits.

In the case where multiple pull-down nodes are disposed, as illustrated in FIG. 1, a pull-down node selection circuit 106 may be disposed in the shift register 100, and the pull-down node selection circuit 106 is used to select a pull-down node to be used, and control the potential at the selected pull-down node. It should be understood that since the shift register according to an embodiment of the present invention may have multiple pull-down nodes and may select to use one or more among the multiple pull-down nodes, the potential at the pull-down node selected for use may be controlled to change, in this description, the "pull-down node" may also be referred to as the "active pull-down node".

In the shift register 100, the pull-down node selection circuit 106 is connected to the first pull-down node selection signal terminal PDS1, the second pull-down node selection signal terminal PDS2, the first pull-down node PD1, the second pull-down node PD2, and the pull-down selection control signal terminal CK3 and the reference signal terminal RS.

The pull-down node selection circuit 106 may be configured to turn on a switching element that internally connects the second pull-down node PD2 and the reference signal terminal RS when a signal is received via the first pull-down node selection signal terminal PDS1, so that during the period in which the potential at the first pull node selection signal terminal PDS1 is a high level, the potential at the second pull-down node PD2 is always a low level, and when a signal is received via the second pull-down node selection signal terminal PDS2, and turn on the switching element that internally connects the first pull-down node PD1 and the reference signal terminal RS, so that the potential at the first pull-down node PD1 is always a low level during a period in which the potential at the second pull-down node selection signal terminal PDS2 is a high level.

In addition, in the case where the shift register 100 includes three or more pull-down nodes, more pull-down node selection signal terminals may be arranged for the shift register 100, and the pull-down node selection circuit 106 is connected to these pull-down node selection signal terminals and all pull-down nodes.

In an example, within a time period determined with one frame or multiple frames as a unit, the potential at one of the multiple pull-down node selection signal terminals (including the first pull-down node selection signal terminal PDS1 and the second pull-down node selection signal terminal PDS2) may be set to a high level, and the pull-down node corresponding to the pull-down node selection signal terminal is selected as an active pull-down node by the pull-down node selection circuit 106 while maintaining the potential at the other inactive pull-down nodes at a low level.

In an example, the third clock signal received via the pull-down selection control signal terminal CK3 may be set as later than the second clock signal received via the second clock signal terminal CK2 (e.g., a rising edge of the high level of the third clock signal may be aligned with a falling edge of the high level of the second clock signal, and the first clock signal and the second clock signal are both at a low level when the third clock signal is at a high level), so as to ensure that the first pull-down circuit 104 and the second pull-down circuit 105 start to operate after both the first output circuit 102 and the second output circuit 103 complete the output operation. In the case where more output circuits are included, the third clock signal may be set as later than the clock signal used for the output circuit which is the last one that completes the output among all the output circuits. For example, a rising edge of the high level of the third clock signal may be aligned with a falling edge of the high level of the clock signal used for the output circuit which is the last one that completes the output among all the output circuits, and the clock signal used for all the output circuits is at a low level when the third clock signal is a high level, so as to ensure that all pull-down circuits start to operate after all output circuits have completed the output operation.

Figure 4:
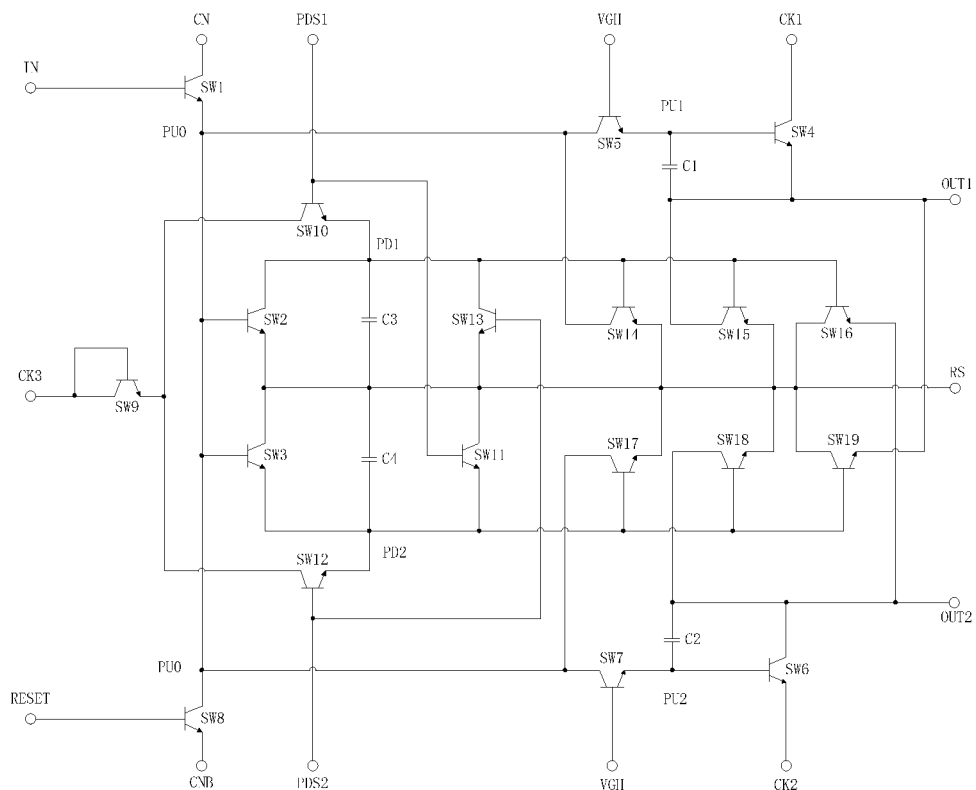
FIG. 4 illustrates an exemplary circuit diagram of a shift register according to an embodiment of the present disclosure.

FIG. 4 illustrates an exemplary circuit structure of the shift register 100. As illustrated in FIG. 4, in the shift register 100, the input circuit 101_1 may include a first input switching element SW1 and a first pull-down node reset switching element SW2, wherein the control terminal, the first terminal and the second terminal of the first input switching element SW1 are connected to the input terminal IN, the first scanning direction control terminal CN and the pull-up node PU0 of the shift register respectively; the control terminal, the first terminal and the second terminal of the first pull-down node reset switching element SW2 are connected to the pull-up node PU0, the first pull-down node PD1 and the reference signal terminal RS respectively.

The reset circuit 101_2 may include a second input switching element SW8 and a second pull-down node reset switching element SW3, wherein the control terminal, the first terminal and the second terminal of the second input switching element SW8 are connected to the reset terminal RESET, the second scanning direction control terminal CNB and the pull-up node PU0 of the shift register respectively; the control terminal, the first terminal and the second terminal of the second pull-down node reset switching element SW3 are connected to the pull-up node PU0, the second pull-down node PD2 and the reference signal terminal RS respectively.

The first output circuit 102 may include a second output switching element SW4, a first output switching element SW5 and a first output capacitor C1, wherein the control terminal, the first terminal and the second terminal of the second output switching element SW4 are connected to the node PU1, the first clock signal terminal CK1 and the first output terminal OUT1 respectively; the two terminals of the first output capacitor C1 are connected to the node PU1 and the first output terminal OUT1 respectively; the control terminal, the first terminal and the second terminal of the first output switching element SW5 are connected to the operating potential terminal VGH, the pull-up node PU0 and the node PU1 respectively.

The second output circuit 103 may include a fourth output switching element SW6, a third output switching element SW7 and a second output capacitor C2, wherein the control terminal, the first terminal and the second terminal of the fourth output switching element SW6 are connected to the node PU2, the second clock signal terminal CK2 and the second output terminal OUT2 respectively; the two terminals of the second output capacitor C2 are connected to the node PU2 and the second output terminal OUT2 respectively; the control terminal, the first terminal and the second terminal of the third output switching element SW7 are connected to the operating potential terminal VGH, the pull-up node PU0 and the node PU2 respectively.

In the first output circuit 102 and the second output circuit 103, the control terminals of the first output switching element SW5 and the third output switching element SW7 are connected to operating potential terminal VGH, and the first output switching element SW5 and the third output switching element SW7 are always in a turned-on state, such that the potentials at the node PU1 in the first output circuit 103 and the node PU2 in the second output circuit 104 are always the same as the potential at the pull-up node PU0. In addition, the first output switching element SW5 and the third output switching element SW7 are optional, and in the case where the first output switching element SW5 and the third output switching element SW7 are not disposed, the node PU1 and the node PU0 (or the pull-up node PU in FIG. 1) are the same node. Since the potentials at the nodes PU0, PU1 and PU2 are always the same, the nodes PU0, PU1 and PU2 can be considered same as the pull-up node PU of the shift register 100 at different positions in the shift register circuit. In fact, in the circuit illustrated in FIG. 4, a node having the same potential as the node PU0 and/or PU1 and/or PU2 at any time can be regarded as the pull-up node PU, "pull-up node PU" is simply used hereinafter to represent these nodes.

The first pull-down circuit 103 may include a first pull-down switching element SW14, a second pull-down switching element SW15 and a third pull-down switching element SW16, wherein the control terminals of the first pull-down switching element SW14, the second pull-down switching element SW15 and the third pull-down switching element SW16 are all connected to the first pull-down node PD1; the first terminals of the first pull-down switching element SW14, the second pull-down switching element SW15 and the third pull-down switching element SW16 are all connected to the reference signal terminal RS; the second terminals of the pull-down switching element SW14, the second pull-down switching element SW15 and the third pull-down switching element SW16 are connected to the node PU0 (or the pull-up node PU), the first output terminal OUT1 and the second output terminal OUT2 respectively.

The second pull-down circuit 104 may include a fourth pull-down switching element SW17, a sixth pull-down switching element SW18 and a fifth pull-down switching element SW19, wherein the control terminals of the fourth pull-down switching element SW17, the sixth pull-down switching element SW18 and the fifth pull-down switching element SW19 are all connected to the second pull-down node PD2; the first terminals of the fourth pull-down switching element SW17, the sixth pull-down switching element SW18 and the fifth pull-down switching element SW19 are all connected to the reference signal terminal RS; the second terminals of the fourth pull-down switching element SW17, the sixth pull-down switching element SW18 and the fifth pull-down switching element SW19 are connected to the node PU0 (or the pull-up node PU), the second output terminal OUT2 and the first output terminal OUT1 respectively.

The pull-down node selection circuit 106 may include a selection control switching element SW9, a first pull-down selection switching element SW10, a second pull-down selection switching element SW11, a third pull-down selection switching element SW12, a fourth pull-down selection switching element SW13, a first capacitor C3 and a second capacitor C4, wherein the control terminal and the first terminal of the selection control switching element SW9 are both connected to the pull-down selection control signal terminal CK3 of the shift register; the second terminal of the selection control switching element SW9 is connected to the first terminal of the first pull-down selection switching element SW10 and to the first terminal of the third pull-down selection switching element SW12; the control terminal and the second terminal of the first pull-down selection switching element SW10 are connected to the first pull-down node selection signal terminal PDS1 and the first pull-down node PD1 respectively; the control terminal and the second terminal of the third pull-down selection switching element SW12 are connected to the second pull-down node selection signal terminal PDS2 and the second pull-down node PD2 respectively; the control terminal, the first terminal and the second terminal of the second pull-down selection switching element SW11 are connected to the first pull-down node selection signal terminal PDS1, the second pull-down node PD2 and the reference signal terminal RS respectively; the control terminal, the first terminal and the second terminal of the fourth pull-down selection switching element SW13 are connected to the second pull-down node selection signal terminal PDS2, the first pull-down node PD1 and the reference signal terminal RS respectively; the first capacitor C3 is disposed between the first pull-down node PD1 and the reference signal terminal RS; the second capacitor C4 is disposed between the second pull-down node PD2 and the reference signal terminal RS.

The structure illustrated in FIG. 4 is merely exemplary, the shift register 100 according to an embodiment of the present disclosure may adopt other implementations. For example, in the case where the bidirectional scanning function is not required to be supported, in the reset circuit 101_2, the switching element SW8 may be connected to the reference signal terminal RS rather than the second scanning signal terminal CNB, and another switching element may also be included, for example, the control terminal, the first terminal and the second terminal of said another switching element are connected to the reset terminal RESET, the first output terminal OUT1 (and/or the second output terminal OUT2) and the reference signal terminal RS respectively. In a further example, more pull-down nodes may be arranged, and more pull-down circuits are arranged accordingly. In a further example, more output terminals may be arranged, and more output circuits are arranged accordingly. The present disclosure is not limited to the exemplary circuit structure illustrated in FIG. 4.

Figure 5:
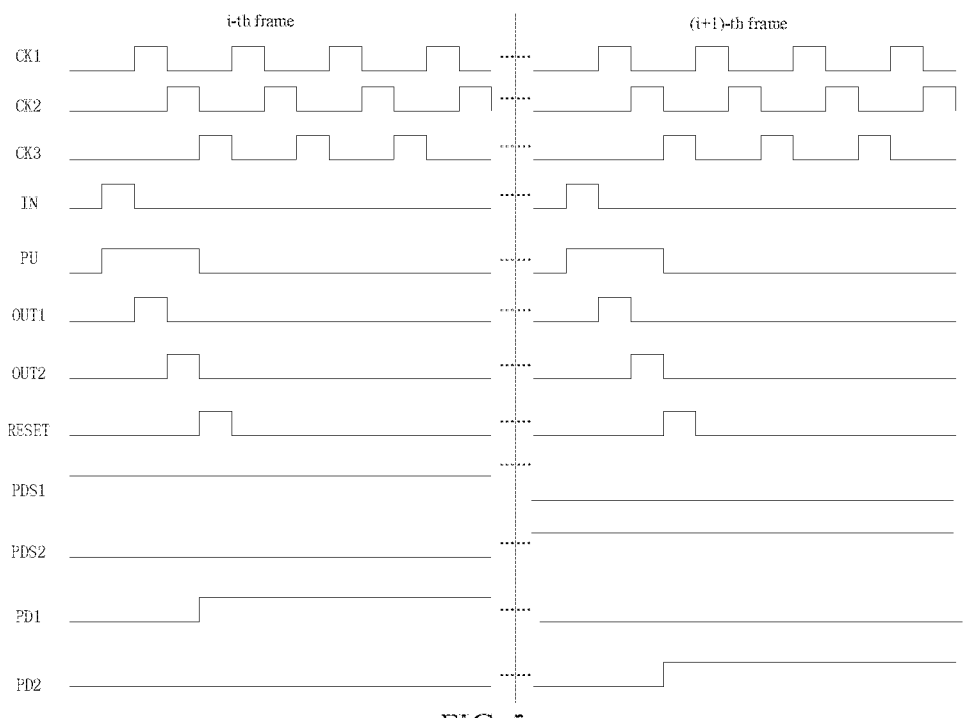
FIG. 5 illustrates an exemplary operation timing of a shift register according to an embodiment of the present disclosure.

FIG. 5 illustrates the operation timing of the shift register 100 illustrated in FIG. 1, FIG. 2 or FIG. 4 in the forward scanning mode (the first scanning direction control terminal CN is at a high level, and the second scanning direction control terminal CNB is at a low level) during two consecutive frames (i-th frame and (i+1)-th frame).

During the i-th frame, the first pull-down node selection signal terminal PDS1 is at a high level, and the second pull-down node selection signal terminal PDS2 is at a low level. In the pull-down node selection circuit 106, the first pull-down selection switching element SW10 and the second pull-down selection switching element SW11 are turned on, and the third pull-down selection switching element SW12 and the fourth pull-down selection switching element SW13 are turned off, thereby selecting the first pull-down node PD1 as the active pull-down node and causing the second pull-down node PD2 to be always at a low level. Correspondingly, during the i-th frame, the fourth pull-down selection switching element SW17, the fifth pull-down selection switching element SW19 and the sixth pull-down selection switching element SW18 in the second pull-down circuit 105 whose controls terminals are connected to the second pull-down node PD2 are all turned-off, thereby causing the second pull-down circuit 105 to not operate during the i-th frame.

When the shift register 100 receives an input signal via the input terminal IN, the first input switching element SW1 and the first pull-down node reset switching element SW2 in the input circuit 101_1 are turned on, so that the potential at the pull-up node PU becomes a high level, the potential at the first pull-down node PD1 becomes a low level. The first output capacitor C1 and the second output capacitor C2 of the first output circuit 102 and the second output circuit 103 start to be charged, and the second output switching element SW4 and the fourth output switching element SW6 are turned on. At this moment, the potentials at the first clock signal terminal CK1 and the second clock signal terminal CK2 are both low levels, so that no gate driving signal is outputted at the first output terminal OUT1 and the second output terminal OUT2.

Subsequently, the potential at the input terminal IN becomes a low level. The potential at the pull-up node PU continues to be maintained at a high level via the first output capacitor C1 and the second output capacitor C2, such that the second output switching element SW4 in the first output circuit 102 and the fourth output switching element SW6 in the second output circuit 103 are still in a turned-on state. At this moment, the potential at the first clock signal terminal CK1 becomes a high level, so that the potential at the first output terminal OUT1 becomes a high level, and thereby a gate driving signal is outputted at the first output terminal OUT1, but the second clock signal terminal CK2 remains at a low level, so there is still no gate driving signal outputted at the second output terminal OUT2. Subsequently, the potential at the first clock signal terminal CK1 becomes a low level, and the potential at the second clock signal terminal CK2 becomes a high level, so that the potential at the first output terminal OUT1 becomes a low level, and the potential at the second output terminal OUT2 becomes a high level, and thereby a gate driving signal is outputted at the second output terminal OUT2.

After the first output circuit 102 and the second output circuit 103 successively output the gate driving signals via the first output terminal OUT1 and the second output terminal OUT2 respectively, the potential at the reset terminal RESET of the shift register 100 becomes a high level, so that the second input switching element SW8 in the reset circuit 101_2 is turned on, thereby causing the potential at the pull-up node PU to be a low level. At the same time, the potential at the pull-down selection control signal terminal CK3 becomes a high level, the selection control switching element SW9 in the pull-down node selection circuit 106 is turned on, so that the first pull-down node PD1 becomes a high level, and the first capacitor C3 in the pull-down node selection circuit 106 starts to be charged. When the first pull-down node PD1 becomes a high level, the first pull-down switching element SW14, the second pull-down switching element SW15 and the third pull-down switching element SW16 in the first pull-down circuit 104 are turned on, so that the potentials at the pull-up node PU, the first output terminal OUT1 and the second output terminal OUT2 become a low level.

Subsequently, when the potential at the pull-down selection control signal terminal CK3 becomes a low level, the potential at the first pull-down node PD1 continues to remain at a high level via the first capacitor C3 in the pull-down node selection circuit 106, and when the potential at the pull-down selection control signal terminal CK3 becomes a high level again, the potential at the first pull-up node PD1 is a high level, and the first capacitor C3 in the pull-down node selection circuit 106 starts to be charged again. This is repeated such that the potential at the first pull-down node PD1 is always a high level.

During the (i+1)-th frame after the i-th frame, the first pull-down node selection signal terminal PDS1 is at a low level, and the second pull-down node selection signal terminal PDS2 is at a high level. In the pull-down node selection circuit 106, the first pull-down selection switching element SW10 and the second pull-down selection switching element SW11 are turned off, the third pull-down selection switching element SW12 and the fourth pull-down selection switching element SW13 are turned on, thereby selecting the second pull-down node PD2 as the active pull-down node and causing the first pull-down node PD1 to be always at a low level. Correspondingly, during the (i+1)-th frame, the first pull-down switching element SW14, the second pull-down switching element SW15 and the third pull-down switching element SW16 in the first pull-down circuit 104 whose control terminals are connected to the first pull-down node PD1 are all turned off, so that the first pull-down circuit 104 does not operate during the (i+1)-th frame.

During the (i+1)-th frame, the operation timing of the shift register is similar to the operation timing during the i-th frame, the same contents will not be repeated. The difference is that when the potential at the pull-down selection control signal terminal CK3 becomes a high level, the selection control switching element SW9 in the pull-down node selection circuit 106 is turned on, the second pull-down node PD2 becomes a high level, and the second capacitor C4 in the pull-down node selection circuit 106 starts to be charged. When the second pull-down node PD2 becomes a high level, the fourth pull-down switching element SW17, the sixth pull-down switching element SW18 and the fifth pull-down switching element SW19 in the second pull-down circuit 105 are turned on, so that the potentials at the pull-up node PU, the second output terminal OUT2 and the first output terminal OUT1 become a low level.

Subsequently, when the potential at the pull-down selection control signal terminal CK3 becomes a low level, the potential at the second pull-down node PD2 continues to remain at a high level via the second capacitor C4 in the pull-down node selection circuit 106, and when the potential at the pull-down selection control signal terminal CK3 becomes a high level again, the potential at the second pull-up node PD2 is a high level, and the second capacitor C4 in the pull-down node selection circuit 106 starts to be charged again. This is repeated such that the potential at the second pull-down node PD2 is always at a high level.

By periodically changing the potentials at the first pull-down node selection signal terminal PDS1 and the second pull-down node selection signal terminal PDS2, two pull-down nodes and two pull-down circuits in the shift register can be alternately used, thereby improving improvement of the circuit reliability.

In the reverse scanning mode, the first scanning direction control terminal CN of the shift register is at a low level, and the second scanning direction control terminal CNB is at a high level. At this moment, the reset circuit 101_2 corresponds to the input circuit 101_1 in the case of forward scanning, and the input circuit 101_1 corresponds to the reset circuit 101_2 in the case of forward scanning. The operation timing of the shift register in the reverse scanning mode is similar to the operation timing in the forward scanning mode, related description is omitted here.

FIG. 5 only illustrates the case where two pull-down nodes are alternately used with one frame as a unit. As described above, two pull-down nodes may be alternately used with multiple frames as a unit according to needs (e.g., two pull-down nodes may be alternately used between every two frames that are adjacent, or two pull-down nodes are alternately used between one frame and three frames that are adjacent, etc.), or more pull-down nodes are arranged, and these pull-down nodes are sequentially used with one or more frames set in advance as a unit. The operation timing of these variant of shift registers is similar to that illustrated in FIG. 5, the difference lies in the switching period of the pull-down node and/or the number of the pull-down nodes, related description is omitted herein.

In the example illustrated in FIG. 5, the duty ratio of each clock signal may be $\frac{1}{3}$. In the case where multiple shift registers are considered to work together (e.g., the gate driving circuit described below with reference to FIG. 7), or in consideration of supporting more output terminals/output circuits, the duty cycle of each clock signal may be set as smaller as needed, for example $\frac{1}{4}$. For example, in the case where multiple shift registers 100 (including two output terminals OUT1 and OUT2) are to operate together, the duty ratio of each clock signal may be set to ¼. In the case of considering that each shift register supports three outputs, the duty ratio of each clock signal can be set to ⅕, and so on, and so forth.

Figure 6:
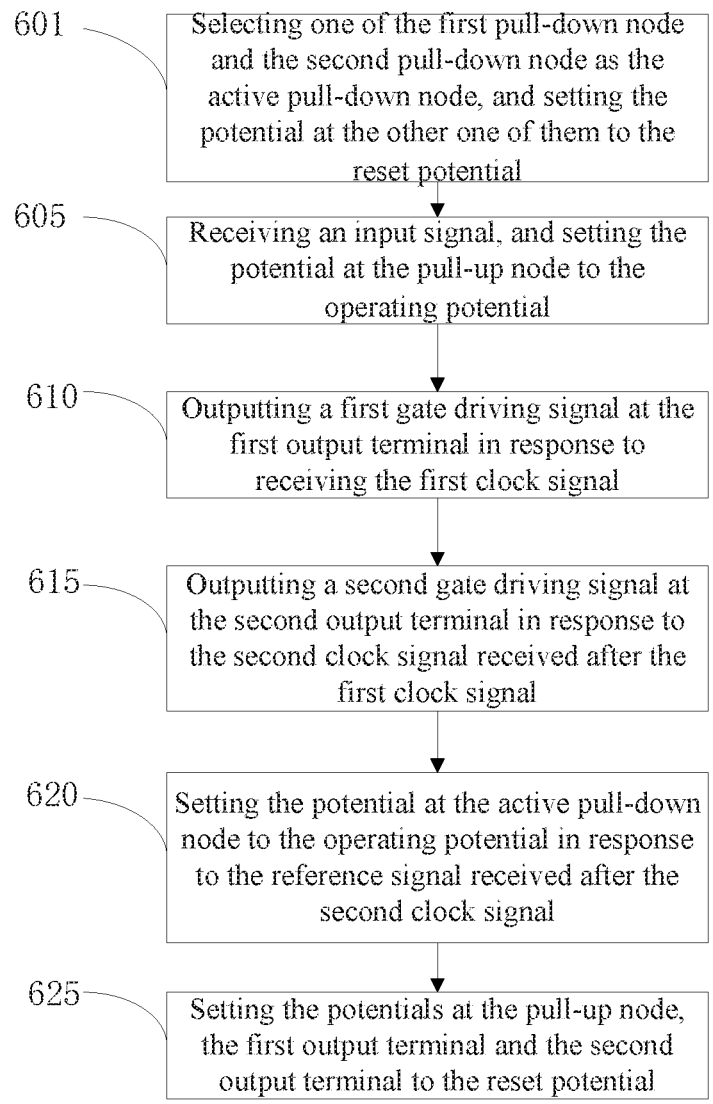
FIG. 6 illustrates an exemplary driving method for a shift register according to an embodiment of the present disclosure.

FIG. 6 illustrates a method for driving a shift register according to an embodiment of the present disclosure.

The exemplary method begins from step 601. In step 601, the shift register selects one of the first pull-down node and the second pull-down node as the active pull-down node and sets the potential at the other one of them to the reset potential. For example, for the exemplary shift register 100 illustrated in FIG. 1, FIG. 2 or FIG. 4, a corresponding signal may be provided to the first pull-down node selection signal terminal PDS1 and the second pull-down node selection signal terminal PDS2 of the shift register 100. The pull-down node selection circuit 106 sets one of the first pull-down node PD1 and the second pull-down node PD2 as the active pull-down node according to the potentials at the first pull-down node selection signal terminal PDS1 and the second pull-down node selection signal terminal PDS2, and sets the potential at the other one of them to remain at a low level at all times. As described above, the first pull-down node PD1 and the second pull-down node PD2 may be alternately used as the active pull-down node in accordance with a preset number of frames.

In step 605, the shift register receives an input signal and sets the potential at the pull-up node to the operating potential. For example, for the exemplary shift register 100 illustrated in FIG. 1, FIG. 2 or FIG. 4, the shift register 100 can set the potential at the pull up node PU (including nodes PU0, PU1 and PU2) to a high level upon receiving an input signal via the input terminal IN. At this moment, the first output terminal OUT1 and the second output terminal OUT2 both have no gate driving signal outputted.

Thereafter, in response to receiving a first clock signal, the method continues to step 610. In step 610, the shift register outputs a first gate driving signal at the first output terminal in response to receiving the first clock signal. For example, for the exemplary shift register 100 illustrated in FIG. 1, FIG. 2 or FIG. 4, the shift register 100 may output a gate driving signal at the first output terminal OUT1 when receiving the first clock signal via the first clock signal terminal CK1 terminal. At this moment, the potential at the pull-up node PU (including the nodes PU0, PU1 and PU2) can be maintained at a high level via the capacitors in the first output circuit 102 and the second output circuit 103, and no gate driving signal is outputted at the second output terminal OUT2.

Thereafter, in response to a second clock signal received after the first clock signal, the method continues to step 615. In step 615, the shift register outputs a second gate driving signal at the second output terminal in response to the second clock signal received after the first clock signal. For example, for the exemplary shift register 100 illustrated in FIG. 1, FIG. 2 or FIG. 4, the shift register 100 may output a gate driving signal at the second output terminal OUT2 when receiving the second clock signal via the second clock signal terminal CK2. At this moment, the potential at the pull-up node PU (including the nodes PU0, PU1 and PU2) is still maintained at a high level via the capacitors in the first output circuit 102 and the second output circuit 103, and no gate driving signal is outputted at the first output terminal OUT1.

Thereafter, in response to the reference signal received after the second clock signal, the method continues to step 620. In step 620, the shift register sets the potential at the active pull-down node to the operating potential in response to the reference signal received after the second clock signal. For example, for the exemplary shift register 100 illustrated in FIG. 1, FIG. 2 or FIG. 4, the shift register 100 can cause the potential at the pull-up node PU (including the nodes PU0, PU1 and PU2) to become a low level when receiving the reference signal via the reset terminal RESET. Meanwhile, the pull-down node selection circuit 106 in the shift register 100 can, in response to a third clock signal received by the shift register 100 via the pull-down selection control signal terminal CK3, set the potential at the first pull-down node PD1 or the second pull-down node PD2 selected as the active pull-down node to a high level.

Thereafter, in step 625, the shift register sets the potentials at the pull-up node, the first output terminal and the second output terminal to the reset potential. For example, for the exemplary shift register 100 illustrated in FIG. 1, FIG. 2 or FIG. 4, when the potential at the active pull-down node (the first pull-down node PD1 or the second pull-down node PD2) is set to a high level, the pull-down circuit corresponding to the active pull-down node (the first pull-down circuit 104 or the second pull-down circuit 105) starts to operate, and the potentials at the pull up node PU (including the nodes PU0, PU1 and PU2), the first output terminal OUT1 and the second output terminal OUT2 are set to a low level. When the shift register 100 receives the third clock signal via the pull-down selection control signal terminal CK3, the capacitor in the pull-down node selection circuit 106 is charged while the potential at the active pull-down node is set to a high level; when the potential at the pull-down selection control signal terminal CK3 of the shift register 100 is a low level, the potential at the active pull-down node continues to remain at a high level via the capacitor in the pull-down node selection circuit 106, so that the pull-down circuit (the first pull-down circuit 104 or the second pull-down circuit 105) corresponding to the active pull-down node is still in an operating state, so that the potentials at the pull-up node PU (including the nodes PU0, PU1 and PU2), the first output terminal OUT1 and the second output terminal OUT2 remain at a low level.

Figure 7:
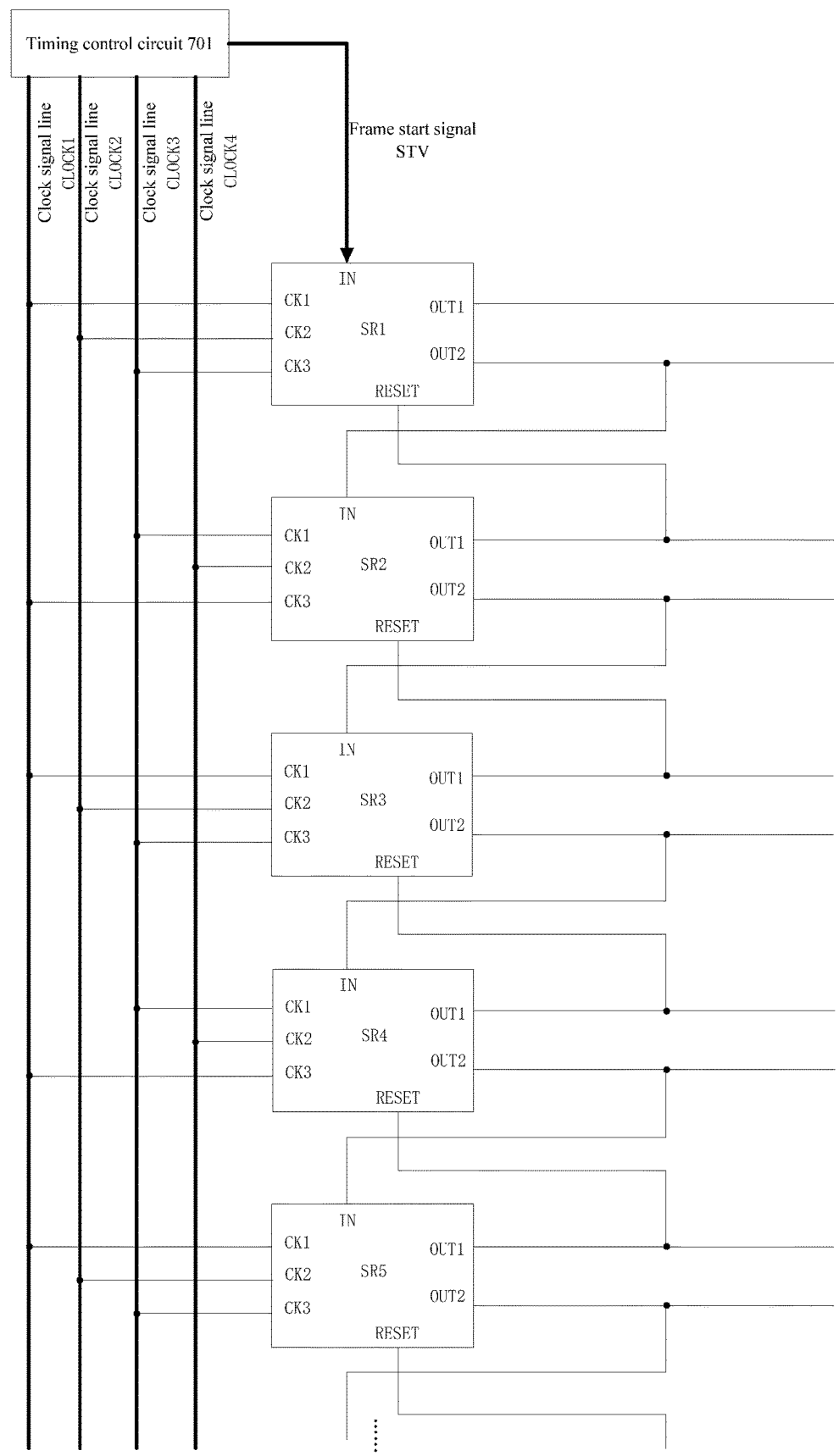
FIG. 7 illustrates an exemplary connection manner of a gate driving circuit comprising a shift register according to an embodiment of the present disclosure.

FIG. 7 illustrates an exemplary connection manner of a gate driving circuit including a shift register according to an embodiment of the present disclosure. Terminals of the shift register, such as the reference signal terminal RS, the operating potential terminal VGH, the first scanning direction control terminal CN, the second scanning direction control terminal CNB, the first pull-down node selection signal terminal PDS1 and the second pull-down node selection signal terminal PDS2, are mainly used to receive external control signals, so these terminals of the shift register are not illustrated in FIG. 7 illustrating the cascading manner of the shift register. In addition, in the example illustrated in FIG. 7, each shift register is the exemplary shift register 100 illustrated in FIG. 1, FIG. 2 or FIG. 4. However, as described above, the shift register according to an embodiment of the present disclosure may have other variants, for example, they may have more output terminals and more clock signal terminals, and these clock signals may be set according to the relationship between the respective clock signals described above.

As illustrated in FIG. 7, in the gate driving circuit according to an embodiment of the present disclosure, the input terminal IN of the shift register SR1 at the first stage receives the frame start signal STY. The input terminal IN of the shift register (e.g., SR2, SR3, SR4, SR5 in FIG. 7) other than the first stage is connected to the second output terminal OUT2 of the corresponding shift register at a previous stage (e.g., SR1, SR2, SR3, SR4 in FIG. 7), that is, the shift register at the stage other than the first stage receives the gate driving signal from the second output terminal OUT2 of the corresponding shift register at the previous stage as its input signal. The reset terminal RESET of the shift register (e.g., SR1, SR2, SR3 and SR4 in FIG. 7) other than the last stage is connected to the first output terminal OUT1 of the corresponding shift register at the next stage (e.g., SR2, SR3, SR4 and SR5 in FIG. 7), that is, the shift register at the stage other than the last stage receives the gate driving signal from the first output terminal OUT1 of the corresponding shift register at a next stage as its reference signal. The reset terminal RESET of the last stage of shift register (not illustrated in FIG. 7) can, for example, receive the frame start signal STV (not illustrated in FIG. 7) during the reverse scanning.

In addition, as illustrated in FIG. 7, clock signals may be supplied to the shift registers at respective stages of the gate driving circuit via the timing control circuit. In the case where the gate driving circuit is formed by the exemplary shift register 100 as illustrated in FIG. 1, FIG. 2 or FIG. 4, clock signals can be provided to the first clock signal terminal CK1, the second clock signal terminal CK2 and the pull-down node selection signal terminal CK3 of the shift register at respective stages via four clock signal lines (CLOCK1, CLOCK2, CLOCK3 and CLOCK4) connected to the timing control circuit 701.

For example, the duty ratio of each clock signal may be set to ¼, and a falling edge of the high level of the clock signal supplied via CLOCK1 is aligned with a rising edge of the high level of the clock signal supplied via CLOCK2; a falling edge of the high level of the clock signal supplied via CLOCK2 is aligned with a rising edge of the high level of the clock signal supplied via CLOCK3; a falling edge of the high level of the clock signal supplied via CLOCK3 is aligned with a rising edge of the high level of the clock signal supplied via CLOCK4; and a falling edge of the high level of the clock signal supplied via CLOCK4 is aligned with a rising edge of the high level of the clock signal supplied via CLOCK1.

The first clock signal terminal CK1, the second clock signal terminal CK2 and the pull-down node selection signal terminal CK3 in the shift register cascaded at an odd-numbered stage may be connected to the clock signal lines CLOCK1, CLOCK2 and CLOCK3 respectively; the first clock signal terminal CK1, the second clock signal terminal CK2 and the pull-down node selection signal terminal CK3 of the shift register cascaded at an even-numbered stage may be connected to the clock signal lines CLOCK3, CLOCK4 and CLOCK1 respectively. Progressive scan outputting of the unilateral gate driving circuit can be realized by providing clock signals to the shift registers at respective stages of the gate driving circuit in the configuration manner illustrated in FIG. 7.

Figure 8:
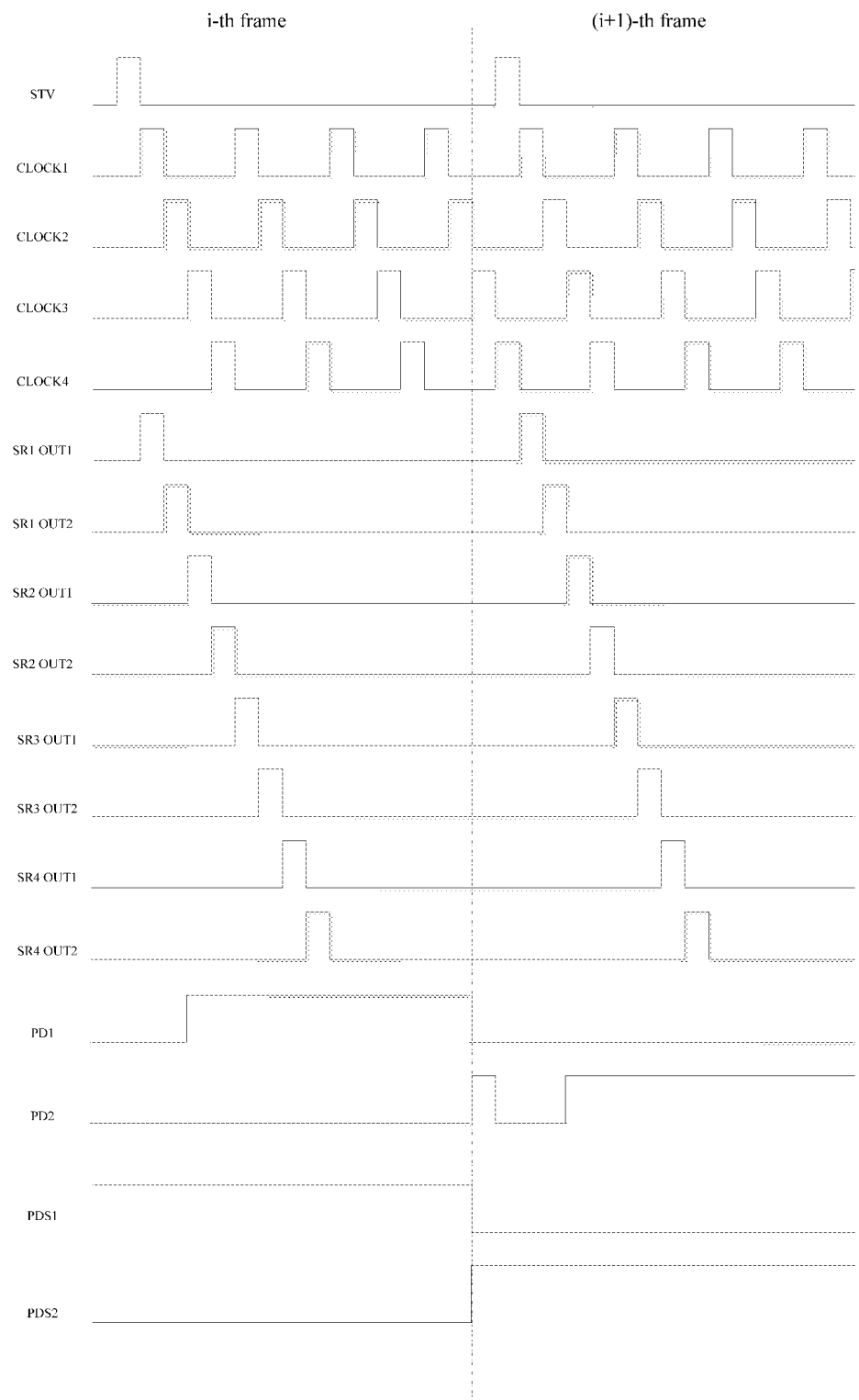
FIG. 8 schematically illustrates an operation timing diagram of the gate driving circuit illustrated in FIG. 7 during two adjacent frames.

FIG. 8 schematically illustrates an operation timing diagram of the gate driving circuit illustrated in FIG. 7 during two adjacent frames (i-th frame and (i+1)-th frame). In FIG. 8, CLOCK1 to CLOCK4 are clock signals having a duty ratio of ¼, and as described above, a falling edge of the high level of the clock signal supplied by CLOCK1 is aligned with a rising edge of the high level of the clock signal supplied by CLOCK2; a falling edge of the high level of the clock signal provided by CLOCK2 is aligned with a rising edge of the high level of the clock signal provided by CLOCK3; a falling edge of the high level of the clock signal provided by CLOCK3 is aligned with a rising edge of the high level of the clock signal supplied by CLOCK4; and a falling edge of the high level of the clock signal provided by CLOCK4 is aligned with a rising edge of the high level of the clock signal provided by CLOCK1.

Within the i-th frame, PSD1 is at a high level, so that the first pull-down node PD1 is selected as the active pull-down node, and the potential at the second pull-down node PD2 is set to the reset potential, and the potential at the node PD1 may be set as the operating potential when the pull-down node selection signal terminal CK3 is at a high level; within the (i+1)-th frame, PSD2 is at a high level, so that the second pull-down node PD2 is selected as the active pull-down node, and the potential at the first pull-down node PD1 is set to the reset potential, and the potential at the PD2 node may be set to the operating potential when the pull-down node selection signal terminal CK3 is at a high level.

According to the configuration manner of the clock signal as illustrated in FIG. 7, the gate driving circuit can realize 8-channel progressive scan outputting of SR1 OUT1-SR4 OUT2 as illustrated in FIG. 8.

Figure 9:
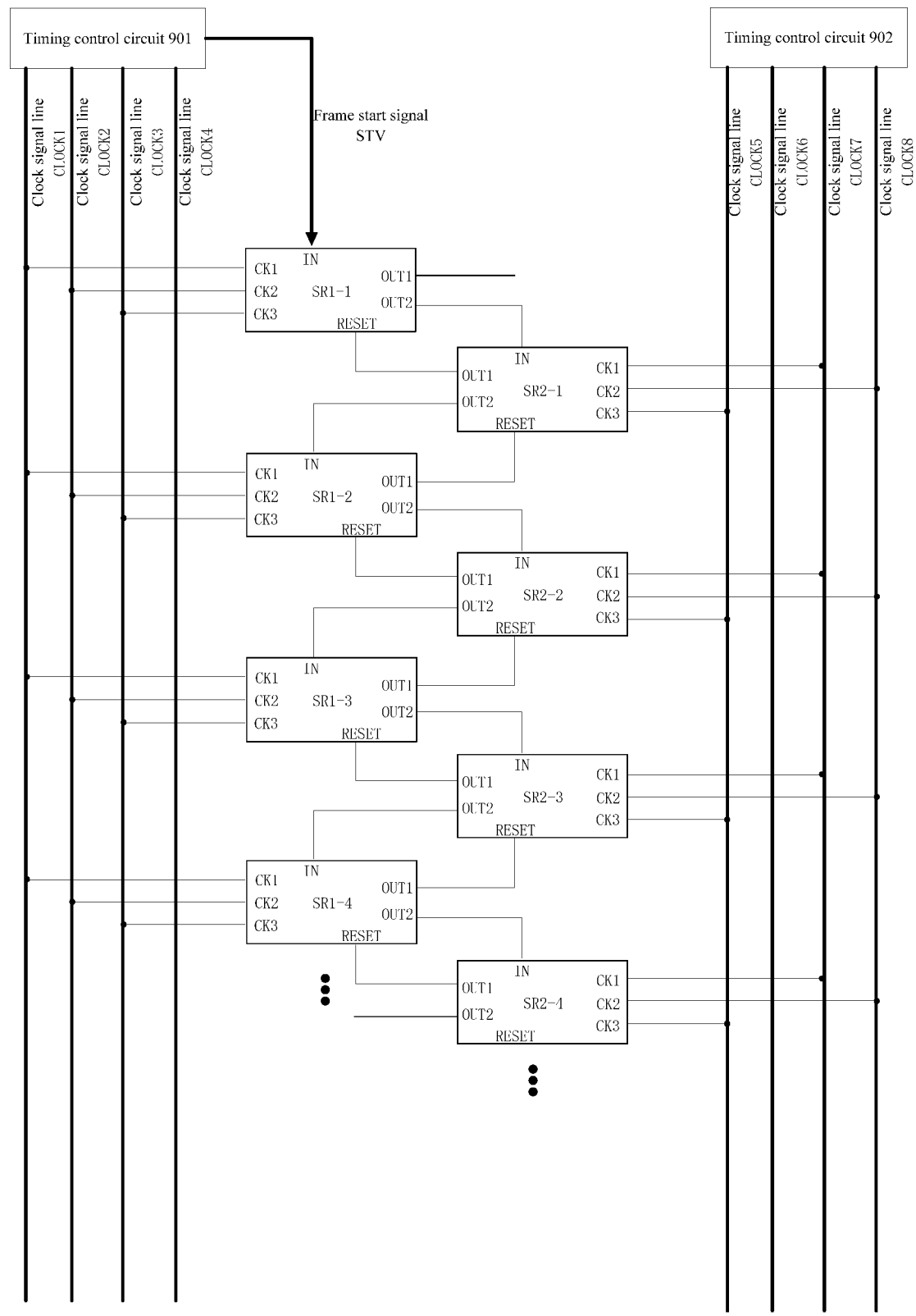
FIG. 9 illustrates another exemplary connection manner of a gate driving circuit comprising a shift register according to an embodiment of the present disclosure.

FIG. 9 illustrates another exemplary connection manner of a gate driving circuit comprising a shift register according to an embodiment of the present disclosure. Specifically, FIG. 9 illustrates a configuration manner of clock signals for the progressive scan outputting of the bilateral gate driving circuit, with each stage of shift register having two output terminals OUT1 and OUT2 as an example. As illustrated in FIG. 9, the bilateral gate driving circuit includes a first gate driving circuit and a second gate driving circuit each gate driving circuit including multiple shift registers. FIG. 9 only schematically illustrates that each gate driving circuit includes four shift registers (SR1-1, SR1-2, SR1-3, SR1-4; and SR2-1, SR2-2, SR2-3, SR2-4), and more shift registers may be included in the actual application.

Connection of the shift register at each stage in the bilateral gate driving circuit illustrated in FIG. 9 is as follows:

the input terminal of the shift register at the first stage of the first gate driving circuit is connected to the frame start signal, and the reset terminal of the shift register at the first stage of the first gate driving circuit is connected to the first output terminal OUT1 of the shift register at the first stage of the second gate driving circuit;

the input terminal of the shift register at the i-th stage of the first gate driving circuit is connected to the second output terminal OUT2 of the shift register at the (i−1)-th stage of the second gate driving circuit, and the reset terminal of the shift register at the i-th stage of the first gate driving circuit is connected to the first output terminal OUT1 of the shift register at the i-th stage of the second gate driving circuit, where $1<i \le N$;

the input terminal of the shift register at the j-th stage of the second gate driving circuit is connected to the second output terminal OUT2 of the shift register at the j-th stage of the first gate driving circuit, and the reset terminal of the shift register at the j-th stage of the second gate driving circuit is connected to the first output terminal OUT1 of the shift register at the (j+1)-th stage of the first gate driving circuit, where $1 \le j<N$.

Specifically, as illustrated in FIG. 9, the input terminal IN of SR1-1 is connected to the frame start signal STV, the second output terminal OUT2 of SR1-1 is connected to the input terminal IN of SR2-1, and the reset terminal RESET of SR1-1 is connected to the first output terminal OUT1 of SR2-1; the input terminal of SR1-2 is connected to the second output terminal OUT of SR2-1, and the reset terminal RESET of SR2-1 is connected to the first output terminal OUT1 of SR1-2, and so on.

In terms of configuration of the clock signals, the first clock signal terminal CK1, the second clock signal terminal CK2 and the pull-down selection signal terminal CK3 of the shift register at a respective stage of the first gate driving circuit are connected to the clock signal lines CLOCK1, CLOCK2 and CLOCK3 provided by the timing control circuit 901 respectively, and the first clock signal terminal CK1, the second clock signal terminal CK2 and the pull-down selection signal terminal CK3 of the shift register at a respective stage of the second gate driving circuit are connected to the clock signal lines CLOCK7, CLOCK8 and CLOCK5 provided by the timing control circuit 902 respectively.

It should be understood that the two timing control circuits 901 and 902 illustrated in FIG. 9 may output four channels of clock signals (CLOCK1-CLOCK8) to control their respective gate driving circuits, or the same timing control circuit may also be used to output four channels of clock signals to control the gate driving circuit. Specifically, when the same timing control circuit is used to output four channels of clock signals, the clock signal line CLOCK7 illustrated in FIG. 9 corresponds to CLOCK3, the clock signal line CLOCK8 corresponds to CLOCK4, and the clock signal line CLOCK5 corresponds to CLOCK1.

With the connection manner of the shift register at a respective stage of the gate driving circuit as illustrated in FIG. 9 and the configuration manner of the clock signals supplied to the shift register at a respective stage, the gate driving circuit can realize bilateral scan outputting.

The operating process of the shift register at each stage in the gate driving circuit illustrated in FIG. 7 or FIG. 9 is similar to the operating process of the exemplary shift register 100 illustrated in FIG. 5, except that the duty ratio of each clock signal in FIG. 5 is ⅓, and the duty ratio of the clock signal received by the shift register at each stage in FIG. 7 or FIG. 9 is ¼.

For example, in the case where the shift register at each stage in the gate driving circuit supports n (n is a positive integer) outputs and correspondingly includes n+1 clock signal terminals, 2*n clock signals can be supplied to the gate driving circuit by the timing control circuit, wherein the duty ratio of each clock signal can be set equal to or less than $1/(2n)$, and these clock signals are respectively supplied to n+1 clock signal terminals of the shift register at each stage in a manner similar to FIG. 7 or FIG. 9.

Figure 10:
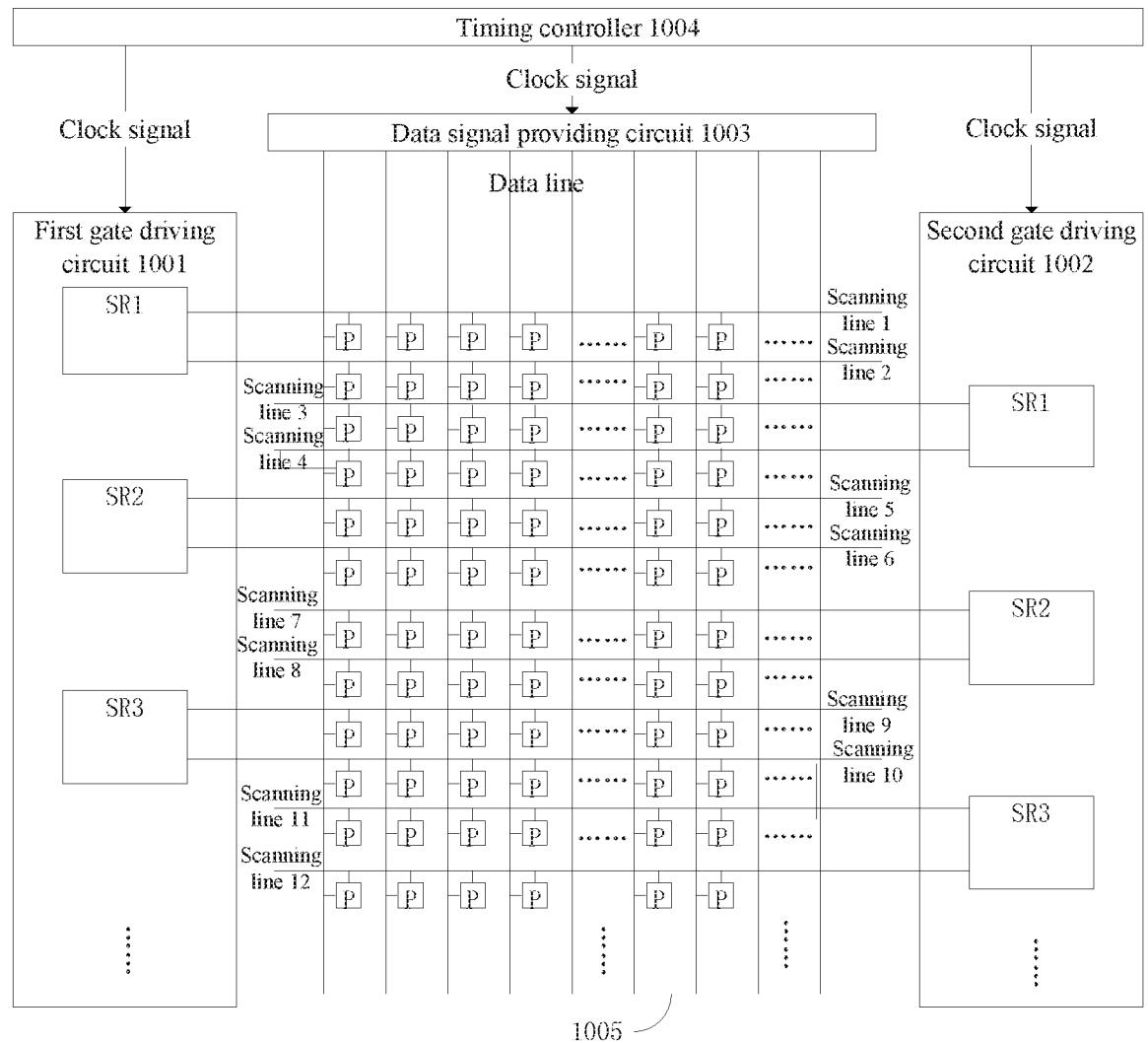
FIG. 10 illustrates a display device according to an embodiment of the present disclosure.

FIG. 10 illustrates a display device according to an embodiment of the present disclosure, wherein the display device includes two gate driving circuits: a first gate driving circuit 1001 and a second gate driving circuit 1002. The cascading structure inside the gate driving circuit is not illustrated in FIG. 10, but only several shift registers SR1-SR3 are exemplarily illustrated. For example, the manner in which the shift registers at respective stages of the two gate driving circuits in the display device illustrated in FIG. 10 are connected may be the manner illustrated in FIG. 9.

As illustrated in FIG. 10, in a display area 1005 of the exemplary display device, for each pair of intersecting data signal line (also referred to as data line, connected to the data signal supplying circuit 1003) and scanning signal line (also referred to as gate line, connected to the first gate driving circuit 1001 and the second gate driving circuit 1002), a pixel P is arranged, and a timing controller 1004 supplies clock signals to the data signal supplying circuit 1003 and the two gate driving circuits 1001, 1002.

In the case where the scanning signal lines are sequentially numbered from top to bottom (e.g., scanning line 1, scanning line 2, scanning line 3 and the like in FIG. 10), in the first gate driving circuit 1001, the first output terminal OUT1 and the second output terminal OUT2 of the shift register cascaded at the i-stage (i is a positive integer) are connected to the (4i−3)-th and (4i−2)-th scanning signal lines respectively, and in the second gate driving circuit 1002, the first output terminal OUT1 and the second output terminal OUT2 of the shift register cascaded at the j-th stage (j is a positive integer) are connected to the (4j−1)th and 4j-th scanning signal lines respectively. For example, in the example illustrated in FIG. 10, the first output terminal OUT1 and the second output terminal OUT2 of the shift register SR1 at the first stage in the first gate driving circuit 1001 are connected to the scanning signal line 1 and the scanning signal line 2 respectively, and the first output terminal OUT1 and the second output terminal OUT2 of the shift register SR1 at the first stage in the second gate driving circuit 1002 are connected to the scanning signal line 3 and the scanning signal line 4 respectively, and so on.

For example, in the case where each shift register in the first gate driving circuit 1001 and the second gate driving circuit 1002 includes three output terminals, the three output terminals of the shift register at the first stage in the driving circuit 1001 may be connected to the first to third scanning signal lines respectively in accordance with a manner similar to that illustrated in FIG. 10, the three output terminals of the shift register at the first stage in the second gate driving circuit 1002 are connected to the 4th to 6th scanning signal lines respectively, the three output terminals of the second stage shift register in the first gate driving circuit 1001 are connected to the 7th to 9th scanning signal lines respectively, the three output terminals of the shift register at the second stage in the gate driving circuit 1002 are connected to the 10th to 12th scanning signal lines, and so on.

In addition, in the display device, a counter (not illustrated in FIG. 10) may be disposed. Whenever a frame start signal is sent to the first gate driving circuit 901, the value of the counter is incremented by one. When the value of the counter reaches a preset value (e.g., preset in a control chip or a controller of the display device), the signals supplied to the first pull-down node selection signal terminal PDS1 and the second pull-down node selection signal terminal PDS2 of the shift register at each stage of the gate driving circuit 1001 and the second gate driving circuit 1002 may be changed by a control circuit or a processor (not illustrated in FIG. 10) in the display device, so that all shift registers in the first gate driving circuit 1001 and the second gate driving circuit 1002 change the corresponding active pull-down node.

The shift register according to an embodiment of the present disclosure can support multiple outputs, and can achieve more reliable circuit reliability by setting two or more pull-down nodes in the shift register and alternately using these pull-down nodes with a predetermined number of frames as a unit. The shift register according to an embodiment of the present disclosure can enhance driving control capability of the single-stage shift register with relatively few switching elements. The gate driving circuit and the display device employing the shift register according to an embodiment of the present disclosure are more reliable, and more advantageous for implementing a narrow bezel onboard display product.

Some embodiments of the present disclosure have been described above. However, the present disclosure is not limited to the examples described, but various modifications and improvements can be made, and such modifications and improvements are also within the scope of the present disclosure.

What is claimed is:

1. A shift register, comprising:
   an input and reset circuit connected to an input terminal, a pull-up node and a reset terminal, and configured to set a potential at the pull-up node to an operating potential when a potential at the input terminal is the operating potential, and set the potential at the pull-up node to a reset potential when a potential at the reset terminal is the operating potential;
   a first output circuit connected to the pull-up node, a first control signal terminal and a first output terminal, and configured to output a first gate driving signal at the first output terminal when the potential at the pull-up node and a potential at the first control signal terminal are the operating potential;
   a second output circuit connected to the pull-up node, a second control signal terminal and a second output terminal, and configured to output a second gate driving signal at the second output terminal when the potential at the pull-up node and a potential at the second control signal terminal are the operating potential;
   a first pull-down circuit connected to a first pull-down node, the pull-up node, the first output terminal and the second output terminal, and configured to set the potentials at the pull-up node, the first output terminal and the second output terminal to the reset potential when a potential at the first pull-down node is the operating potential;
   a second pull-down circuit connected to a second pull-down node, the pull-up node, the first output terminal and the second output terminal, and configured to set the potentials at the pull-up node, the first output terminal and the second output terminal to the reset potential when a potential at the second pull-down node is the operating potential; and
   a pull-down node selection circuit connected to a first pull-down node selection signal terminal, a second pull-down node selection signal terminal, the first pull-down node and the second pull-down node, and configured to select one of the first pull-down node and the second pull-down node as an active pull-down node according to the potential at the first pull-down node selection signal terminal and the potential at the second pull-down node selection signal terminal;
   wherein the pull-down node selection circuit comprises:
   a first pull-down selection switching element, a control terminal thereof being connected to the first pull-down node selection signal terminal, and one of a first terminal and a second terminal thereof being connected to the first pull-down node;
   a second pull-down selection switching element, a control terminal thereof being connected to the first pull-down node selection signal terminal, one of a first terminal and a second terminal thereof being connected to the second pull-down node, and the other one of the first terminal and the second terminal thereof being connected to a reference signal terminal;
   a third pull-down selection switching element, a control terminal thereof being connected to the second pull-down node selection signal terminal, one of a first terminal and a second terminal thereof being connected to the second pull-down node, and the other one of the first terminal and the second terminal thereof being connected to the other one of the first terminal and the second terminal of the first pull-down selection switching element; and
   a fourth pull-down selection switching element, a control terminal thereof being connected to the second pull-down node selection signal terminal, one of a first terminal and a second terminal thereof being connected to the first pull-down node, and the other one of the first terminal and the second terminal thereof being connected to the reference signal terminal.

2. The shift register according to claim 1, wherein the pull-down node selection circuit further comprises:
   a first capacitor connected between the first pull-down node and the reference signal terminal; and
   a second capacitor connected between the second pull-down node and the reference signal terminal.

3. The shift register according to claim 1, wherein the pull-down node selection circuit further comprises:
   a selection control switching element, a control terminal thereof and one of a first terminal and a second terminal thereof being both connected to the pull-down selection control signal terminal, and the other one of the first terminal and the second terminal thereof being connected to the other one of the first terminal and the second terminal of the first pull-down selection switching element and to the other one of the first terminal and the second terminal of the third pull-down selection switching element.

4. The shift register according to claim 1, wherein the input and reset circuit comprises:
   a first input switching element, a control terminal thereof being connected to the input terminal, one of a first terminal and a second terminal thereof being connected to a first scanning control signal terminal, and the other one of the first terminal and the second terminal thereof being connected to the pull-up node; and
   a second input switching element, a control terminal thereof being connected to the reset terminal, one of a first terminal and a second terminal thereof being connected to a second scanning control signal terminal, and the other one of the first terminal and the second terminal thereof being connected to the pull-up node,
   wherein the potential of a first scanning control signal is the operating potential and the potential of a second scanning control signal is the reset potential during a forward scanning, and the potential of the first scanning control signal is the reset potential and the potential of the second scanning control signal is the operating potential during a reverse scanning.

5. The shift register according to claim 4, wherein the input and reset circuit further comprises:
   a first pull-down node reset switching element, a control terminal thereof being connected to the pull-up node, one of a first terminal and a second terminal thereof being connected to the first pull-down node, and the other one of the first terminal and the second terminal thereof being connected to the reference signal terminal; and
   a second pull-down node reset switching element, a control terminal thereof being connected to the pull-up node, one of a first terminal and a second terminal thereof being connected to the second pull-down node, and the other one of the first terminal and the second terminal thereof being connected to the reference signal terminal.

6. The shift register according to claim 1, wherein the first output circuit comprises:

a first output switching element, a control terminal thereof being connected to an operating potential terminal, and one of a first terminal and a second terminal thereof being connected to the pull-up node;

a second output switching element, a control terminal thereof being connected to the other one of the first terminal and the second terminal of the first output switching element, one of a first terminal and a second terminal thereof being connected to the first control signal terminal, the other one of the first terminal and the second terminal thereof being connected to the first output terminal; and a first output capacitor connected between the control terminal of the second output switching element and the first output terminal.

7. The shift register according to claim 1, wherein the second output circuit comprises:

a third output switching element, a control terminal thereof being connected to the operating potential terminal, and one of a first terminal and a second terminal thereof being connected to the pull-up node;

a fourth output switching element, a control terminal thereof being connected to the other one of the first terminal and the second terminal of the third output switching element, one of a first terminal and a second terminal thereof being connected to the second control signal terminal, and the other of the first terminal and the second terminal thereof being connected to the second output terminal; and a second output capacitor connected between the control terminal of the fourth output switching element and the second output terminal.

8. The shift register according to claim 1, wherein the first pull-down circuit comprises:

a first pull-down switching element, a control terminal thereof being connected to the first pull-down node, one of a first terminal and a second terminal thereof being connected to the pull-up node, and the other one of the first terminal and the second terminal thereof being connected to the reference signal terminal;

a second pull-down switching element, a control terminal thereof being connected to the first pull-down node, one of a first terminal and a second terminal being connected to the first output terminal, and the other one of the first terminal and the second terminal thereof being connected to the reference signal terminal; and a third pull-down switching element, a control terminal thereof being connected to the first pull-down node, one of a first terminal and a second terminal thereof being connected to the second output terminal, and the other one of the first terminal and the second terminal thereof being connected to the reference signal terminal.

9. The shift register according to claim 1, wherein the second pull-down circuit comprises:

a fourth pull-down switching element, a control terminal thereof being connected to the second pull-down node, one of a first terminal and a second terminal thereof being connected to the pull-up node, and the other one of the first terminal and the second terminal thereof being connected to the reference signal terminal;

a fifth pull-down switching element, a control terminal thereof being connected to the second pull-down node, one of a first terminal and a second terminal thereof being connected to the first output terminal, and the other one of the first terminal and the second terminal thereof being connected to the reference signal terminal; and a sixth pull-down switching element, a control terminal thereof being connected to the second pull-down node, one of a first terminal and a second terminal thereof being connected to the second output terminal, and the other one of the first terminal and the second terminal thereof being connected to the reference signal terminal.

10. A gate driving circuit, comprising multiple cascaded shift registers according to claim 1, wherein except the shift register at a first stage, an input terminal of the shift register at each of other stages is connected to a second output terminal of the shift register cascaded at a previous stage, and except the shift register at a last stage, a reset terminal of the shift register at each of the other stages is connected to a first output terminal of the shift register at a next stage.

11. A display device, comprising a first gate driving circuit and a second gate driving circuit, the first gate driving circuit comprising N cascaded shift registers according to claim 1, the second gate driving circuit comprising N cascaded shift registers according to claim 1; wherein a reset terminal of the shift register at a first stage of the first gate driving circuit is connected to a first output terminal of the shift register at the first stage of a second gate driving circuit;

an input terminal of the shift register at an i-th stage of the first gate driving circuit is connected to a second output terminal of the shift register at a (i−1)th stage of the second gate driving circuit, and a reset terminal of the shift register at the i-th stage of the first gate driving circuit is connected to a first output terminal of the shift register at the i-th stage of the second gate driving circuit, where 1<i≤N;

an input terminal of the shift register at a j-th stage of the second gate driving circuit is connected to a second output terminal of the shift register at a j-th stage of the first gate driving circuit, and a reset terminal of the shift register at the j-th stage of the second gate driving circuit is connected to a first output terminal of the shift register at a (j+1)-th stage of the first gate driving circuit, where 1≤j<N.

12. A method for driving the shift register according to claim 1, comprising:

within two adjacent frames, alternately setting one of the first pull-down node and the second pull-down node as the active pull-down node, and setting the potential at one of the first pull-down node and the second pull-down node to the reset potential in a case where the other of the first pull-down node and the second pull-down node is set as the active pull-down node;

within each frame, for the shift register at each stage, in a first period, in response to receipt of the input signal, pulling up the potential at the pull-up node to the operating potential;

in a second period, in response to receipt of the first clock signal, outputting the first gate driving signal at the first output terminal, and in response to the second clock signal received after the first clock signal, outputting the second gate driving signal at the second output terminal;

in a third period, in response to the reference signal received after the second clock signal, setting the potential at the active pull-down node to the operating potential; and setting the potentials at the pull-up node, the first output terminal and the second output terminal to the reset potential.

13. The method according to claim 12, wherein the first pull-down node and the second pull-down node are alternately selected as the active pull-down node in accordance with a predetermined number of frames.

14. The gate driving circuit according to claim 10, wherein the pull-down node selection circuit comprises:
 a first pull-down selection switching element, a control terminal thereof being connected to the first pull-down node selection signal terminal, and one of a first terminal and a second terminal thereof being connected to the first pull-down node;
 a second pull-down selection switching element, a control terminal thereof being connected to the first pull-down node selection signal terminal, one of a first terminal and a second terminal thereof being connected to the second pull-down node, and the other one of the first terminal and the second terminal thereof being connected to a reference signal terminal;
 a third pull-down selection switching element, a control terminal thereof being connected to the second pull-down node selection signal terminal, one of a first terminal and a second terminal thereof being connected to the second pull-down node, and the other one of the first terminal and the second terminal thereof being connected to the other one of the first terminal and the second terminal of the first pull-down selection switching element; and
 a fourth pull-down selection switching element, a control terminal thereof being connected to the second pull-down node selection signal terminal, one of a first terminal and a second terminal thereof being connected to the first pull-down node, and the other one of the first terminal and the second terminal thereof being connected to the reference signal terminal.

15. The gate driving circuit according to claim 14, wherein the pull-down node selection circuit further comprises:
 a first capacitor connected between the first pull-down node and the reference signal terminal; and
 a second capacitor connected between the second pull-down node and the reference signal terminal.

16. The gate driving circuit according to claim 14, wherein the pull-down node selection circuit further comprises:
 a selection control switching element, a control terminal thereof and one of a first terminal and a second terminal thereof being both connected to the pull-down selection control signal terminal, and the other one of the first terminal and the second terminal thereof being connected to the other one of the first terminal and the second terminal of the first pull-down selection switching element and to the other one of the first terminal and the second terminal of the third pull-down selection switching element.

17. The gate driving circuit according to claim 10, wherein the input and reset circuit comprises:
 a first input switching element, a control terminal thereof being connected to the input terminal, one of a first terminal and a second terminal thereof being connected to a first scanning control signal terminal, and the other one of the first terminal and the second terminal thereof being connected to the pull-up node; and
 a second input switching element, a control terminal thereof being connected to the reset terminal, one of a first terminal and a second terminal thereof being connected to a second scanning control signal terminal, and the other one of the first terminal and the second terminal thereof being connected to the pull-up node,
 wherein the potential of a first scanning control signal is the operating potential and the potential of a second scanning control signal is the reset potential during a forward scanning, and the potential of the first scanning control signal is the reset potential and the potential of the second scanning control signal is the operating potential during a reverse scanning.

18. The gate driving circuit according to claim 17, wherein the input and reset circuit further comprises:
 a first pull-down node reset switching element, a control terminal thereof being connected to the pull-up node, one of a first terminal and a second terminal thereof being connected to the first pull-down node, and the other one of the first terminal and the second terminal thereof being connected to the reference signal terminal; and
 a second pull-down node reset switching element, a control terminal thereof being connected to the pull-up node, one of a first terminal and a second terminal thereof being connected to the second pull-down node, and the other one of the first terminal and the second terminal thereof being connected to the reference signal terminal.

19. The shift register according to claim 10, wherein the first output circuit comprises:
 a first output switching element, a control terminal thereof being connected to an operating potential terminal, and one of a first terminal and a second terminal thereof being connected to the pull-up node;
 a second output switching element, a control terminal thereof being connected to the other one of the first terminal and the second terminal of the first output switching element, one of a first terminal and a second terminal thereof being connected to the first control signal terminal, the other one of the first terminal and the second terminal thereof being connected to the first output terminal; and
 a first output capacitor connected between the control terminal of the second output switching element and the first output terminal.

* * * * *